United States Patent [19]
Gardner et al.

[11] Patent Number: 6,100,146
[45] Date of Patent: *Aug. 8, 2000

[54] METHOD OF FORMING TRENCH TRANSISTOR WITH INSULATIVE SPACERS

[75] Inventors: Mark I. Gardner, Cedar Creek; Robert Dawson, Austin; H. Jim Fulford, Jr., Austin; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/739,595

[22] Filed: Oct. 30, 1996

[51] Int. Cl.$^7$ .................................................. H01L 21/336
[52] U.S. Cl. .............................................. 438/301; 438/589
[58] Field of Search ................................ 437/29, 34, 40, 437/41, 43, 44; 438/133, 197, 246, 247, 589, 307

[56] References Cited

U.S. PATENT DOCUMENTS

| | | | |
|---|---|---|---|
| 4,745,086 | 5/1988 | Parrillo et al. | 437/44 |
| 4,830,975 | 5/1989 | Bovaird et al. | 437/41 |
| 5,094,973 | 3/1992 | Pang | 437/67 |
| 5,141,891 | 8/1992 | Arima et al. | 437/44 |
| 5,166,084 | 11/1992 | Pfiester | 437/29 |
| 5,175,118 | 12/1992 | Yoneda | 437/44 |
| 5,231,038 | 7/1993 | Yamaguchi et al. | 437/44 |
| 5,362,662 | 11/1994 | Ando et al. | 437/52 |
| 5,451,804 | 9/1995 | Lur et al. | 257/330 |
| 5,504,031 | 4/1996 | Hsu et al. | 437/57 |
| 5,512,506 | 4/1996 | Chang et al. | 437/44 |
| 5,538,913 | 7/1996 | Hong | 437/44 |
| 5,545,579 | 8/1996 | Liang et al. | 437/44 |
| 5,547,884 | 8/1996 | Yamaguchi et al. | 437/43 |
| 5,554,550 | 9/1996 | Yang | 437/43 |
| 5,567,635 | 10/1996 | Acovic et al. | 437/43 |
| 5,571,738 | 11/1996 | Krivokapic | 437/44 |
| 5,574,302 | 11/1996 | Wen et al. | 257/330 |
| 5,587,331 | 12/1996 | Jun | 437/41 |
| 5,610,091 | 3/1997 | Cho | 437/43 |
| 5,640,034 | 6/1997 | Malhi | 257/341 |

FOREIGN PATENT DOCUMENTS

| | | |
|---|---|---|
| 64-4058 | 1/1989 | Japan . |
| 2-22868 | 1/1990 | Japan . |

*Primary Examiner*—John Niebling
*Assistant Examiner*—Michael S. Lebentritt
*Attorney, Agent, or Firm*—Skjerven, Morrill, MacPherson, Franklin & Friel, LLP

[57] ABSTRACT

An IGFET with a gate electrode and insulative spacers in a trench is disclosed. The IGFET includes a trench with opposing sidewalls and a bottom surface in a semiconductor substrate, a gate insulator on the bottom surface, a gate electrode on the gate insulator, and insulative spacers between the gate electrode and the sidewalls. A method of forming the IGFET includes implanting a doped layer into the substrate, etching completely through the doped layer and partially through the substrate to form the trench and split the doped layer into source and drain regions, depositing a blanket layer of insulative spacer material over the substrate and applying an anisotropic etch to form the insulative spacers on the sidewalls, growing the gate insulator on a central portion of the bottom surface between the insulative spacers, depositing a gate electrode material on the gate insulator and the insulative spacers, polishing the gate electrode material so that the gate electrode is substantially aligned with a top surface of the substrate, and applying a high-temperature anneal to diffuse the source and drain regions beneath the bottom surface, thereby forming a source and drain with channel junctions substantially aligned with the gate electrode. Advantageously, the channel length is significantly smaller than the trench length.

40 Claims, 16 Drawing Sheets

METHOD OF FORMING TRENCH TRANSISTOR WITH INSULATIVE SPACERS

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a drain and a source. The channel, source and drain are located in a semiconductor substrate, with the substrate being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

Furthermore, scaling down the horizontal dimensions generally requires a corresponding decrease in the vertical dimensions. As IGFET vertical dimensions are reduced and the supply voltage remains constant (e.g., 3 V), the maximum lateral electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. Reducing the electric field on the order of 30–40% can reduce hot-electron-induced currents by several orders of magnitude. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however LDD structures are typically formed for both the source and drain to avoid the need for an additional masking step.

In the manufacture of integrated circuits, the planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

Accordingly, a need exists for an IGFET that can be manufactured with reduced horizontal dimensions, that preferably includes an LDD as well as a substantially planar top surface. It is especially desirable that the IGFET have a channel length that can be significantly smaller than the minimum resolution of the available lithographic system.

SUMMARY OF THE INVENTION

The present invention provides an insulated-gate field-effect transistor (IGFET) with a gate electrode in a trench (i.e., a trench transistor) and insulative spacers in the trench. A gate insulator is disposed on the bottom surface of the trench, the gate electrode is disposed on the gate insulator, and the insulative spacers are disposed between the gate electrode and opposing sidewalls of the trench. A source, drain and channel are adjacent to the bottom surface of the trench. Preferably, the channel is substantially aligned with the bottom surface of the gate electrode. If the trench length corresponds to the minimum resolution of a lithographic system, then the channel length is significantly smaller than the minimum resolution. Furthermore, lightly doped regions of the source and drain can be adjacent to the bottom surface of the trench, and the gate electrode can be substantially aligned with the top surface of the substrate. In this manner, a highly miniaturized IGFET can be produced.

A key feature of the invention is the use of insulative spacers in the trench that contact the gate electrode and are disposed between the gate electrode and opposing sidewalls of the trench.

Preferably, the source and drain include heavily doped regions adjacent to the top surface of the substrate. The insulative spacers can be disposed on the gate insulator which is disposed on the entire bottom surface, or alternatively, the insulative spacers can disposed on the bottom surface adjacent to the sidewalls and the gate insulator can be disposed on a central portion of the bottom surface between the insulative spacers. It is also preferred that substantially all of the gate electrode is within the trench, and that the channel length is less than half the trench length and less than 2000 angstroms. As exemplary materials, the gate electrode is polysilicon, the gate insulator is silicon dioxide, and the insulative spacers are silicon dioxide or silicon nitride.

Another aspect of the invention is a method of forming an IGFET. The method includes forming a trench in a substrate, forming insulative spacers in the trench, forming a gate insulator on the bottom surface of the trench, forming a gate electrode on the gate insulator and the insulative spacers, with the insulative spacers between the gate electrode and opposing sidewalls of the trench, and forming a source and drain adjacent to the bottom surface. The gate insulator can be formed either before or after the insulative spacers are formed. Likewise, the source and drain can be implanted into the substrate either before or after the trench is formed, either before or after the insulative spacers are formed, and either before or after the gate electrode is formed. Preferably, the insulative spacers are formed by depositing a blanket layer of insulative spacer material over the substrate and then applying an anisotropic etch, and the gate electrode is formed by depositing a blanket layer of gate electrode material over the substrate and then polishing the gate electrode material until the gate electrode is substantially aligned with a planar top surface of the substrate.

A first embodiment of the method includes providing a P-type substrate, implanting an N+ doped layer into the substrate, patterning a photoresist layer over the substrate, etching a trench completely through the doped layer and partially through the substrate to split the doped layer into source and drain regions, stripping the photoresist layer, forming insulative spacers on the bottom surface and sidewalls of the trench, forming a gate insulator on a central portion of the bottom surface between the insulative spacers, depositing a gate electrode material over the substrate, polishing the gate electrode material to form a gate electrode substantially aligned with a planar top surface of the substrate, and applying a high-temperature anneal to form the source and drain by activating the source and drain regions and diff-using the source and drain regions beneath the bottom surface.

A second embodiment of the method includes providing a P-type substrate, implanting an N+ doped layer into the substrate, patterning a photoresist layer over the substrate, etching a trench completely through the doped layer and partially through the substrate to split the doped layer into source and drain regions, stripping the photoresist layer, forming a continuous insulative layer in the trench that includes a gate insulator on the bottom surface and sidewall insulators on the sidewalls, forming insulative spacers on the gate insulator and sidewall insulators such that the gate insulator on a central portion of the bottom surface is exposed, depositing a gate electrode material over the substrate, polishing the gate electrode material to form a gate electrode substantially aligned with a planar top surface of the substrate, and applying a high-temperature anneal to form the source and drain by activating the source and drain regions and diffusing the source and drain regions beneath the bottom surface.

A third embodiment of the method includes providing a P-type substrate, patterning a photoresist layer over the substrate, etching a trench partially through the substrate, stripping the photoresist layer, forming insulative spacers on the bottom surface and sidewalls of the trench, forming a gate insulator on a central portion of the bottom surface between the insulative spacers, depositing a gate electrode material over the substrate, polishing the gate electrode material to form a gate electrode substantially aligned with a planar top surface of the substrate, implanting N+ source and drain regions using the gate electrode as insulative spacers as an implant mask for the bottom surface, and applying a high-temperature anneal to form the source and drain by activating the source and drain regions and diffusing the source and drain regions beneath the bottom surface.

A fourth embodiment of the method includes providing a P-type substrate, implanting a doped layer that includes an N+ doped upper layer and an N− doped lower layer into the substrate, patterning a photoresist layer over the substrate, etching a trench completely through the doped upper layer and partially through the doped lower layer to split the doped upper layer into heavily doped source and drain regions, stripping the photoresist layer, forming insulative spacers on the bottom surface and sidewalls of the trench, counterdoping the substrate beneath a central portion of the bottom surface between the insulative spacers to form a P-type channel that splits the doped lower layer into lightly doped source and drain regions, forming a gate insulator on the central portion of the bottom surface, depositing a gate electrode material over the substrate, polishing the gate electrode material to form a gate electrode substantially aligned with a planar top surface of the substrate, and applying a high-temperature anneal to form the source and drain by activating the lightly and heavily doped source and drain regions.

A fifth embodiment of the method includes providing a P-type substrate, implanting an N+ doped first layer into the substrate, patterning a photoresist layer over the substrate, etching a trench completely through the doped first layer and partially through the substrate to split the doped first layer into heavily doped source and drain regions, implanting an N− doped second layer into the substrate beneath the bottom surface, stripping the photoresist layer, forming insulative spacers on the bottom surface and sidewalls of the trench, counterdoping the substrate beneath a central portion of the bottom surface between the insulative spacers to form a P-type channel that splits the doped second layer into lightly doped source and drain regions, forming a gate insulator on the central portion of the bottom surface, depositing a gate electrode material over the substrate, polishing the gate electrode material to form a gate electrode substantially aligned with a planar top surface of the substrate, and applying a high-temperature anneal to form the source and drain by activating and merging the lightly and heavily doped source and drain regions.

A primary advantage of the invention is that the IGFET can have a channel length that is significantly smaller than the minimum resolution of the available lithographic system, thereby providing a next generation transistor with the present generation lithography. As further advantages, the source and drain can include lightly doped regions adjacent to the channel and heavily doped regions adjacent to the top surface of the substrate, and the gate electrode can be substantially aligned with the top surface of the substrate.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
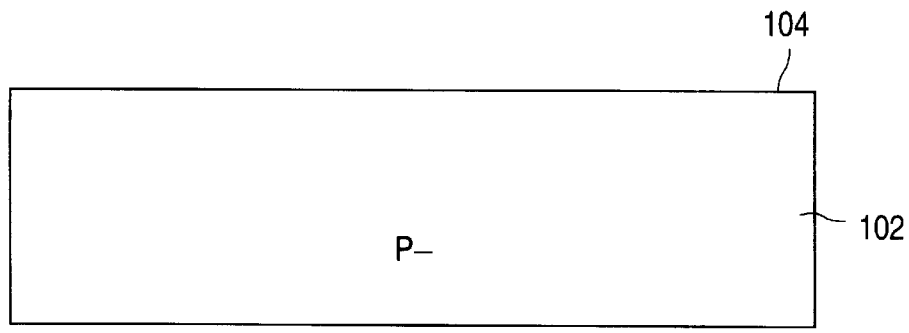
FIGS. 1A–1J show cross-sectional views of successive process steps for forming an IGFET with a gate electrode and insulative spacers in a trench in accordance with a first embodiment of the invention.

In the drawings, depicted elements are not necessarily drawn to scale and like or similar elements may be designated by the same reference numeral throughout the several views.

FIGS. 1A–1J show cross-sectional views of successive process steps for forming an IGFET with a gate electrode and insulative spacers in a trench in accordance with a first embodiment of the invention.

In FIG. 1A, a semiconductor substrate suitable for integrated circuit manufacture is provided. For instance, substrate 102 includes a P– epitaxial surface layer with a <100> orientation, a boron concentration of $1\times10^{15}$ atoms/cm$^3$ and a resistivity of 12 ohm-cm. Preferably, the epitaxial surface layer is disposed on a P+ base layer (not shown) and has a planar top surface 104.

Figure 1B:
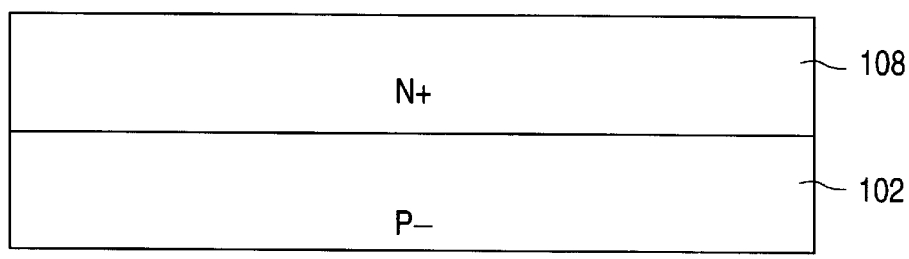

In FIG. 1B, substrate 102 is subjected to ion implantation of arsenic and phosphorus, indicated by arrows 106, at a combined dosage in the range of $1\times10^{15}$ to $5\times10^{15}$ atoms/cm$^2$ and an energy in the range of 2 to 80 kiloelectron-volts. Preferably, the arsenic dosage is about an order of magnitude greater than the phosphorus dosage. This forms N+ doped layer 108 with a combined arsenic and phosphorus concentration in the range of $1\times10^{20}$ to $1\times10^{21}$ atoms/cm$^3$ and a depth of 1800 angstroms. Doped layer 108 has a graded doping profile in the vertical direction so that the deepest regions are the most lightly doped.

Figure 1C:
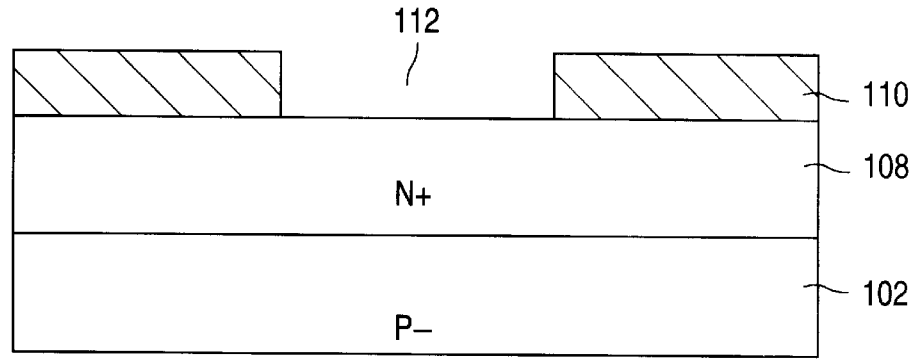

In FIG. 1C, photoresist layer 110 is deposited as a continuous layer on top surface 104 and then selectively irradiated using a photolithographic system, such as a step and repeat optical projection system, in which I-line ultraviolet light from a mercury-vapor lamp is projected through a reticle and a focusing lens to project the desired image pattern on photoresist layer 110. Thereafter, photoresist layer 110 is developed and the irradiated portions are removed to provide opening 112 that defines the lateral boundaries for a trench. The minimum resolution (i.e. linewidth and spacing) of the step and repeat system is 4000 angstroms (0.4 microns). Therefore, to reduce feature sizes, the length of opening 112 is 4000 angstroms.

Figure 1D:
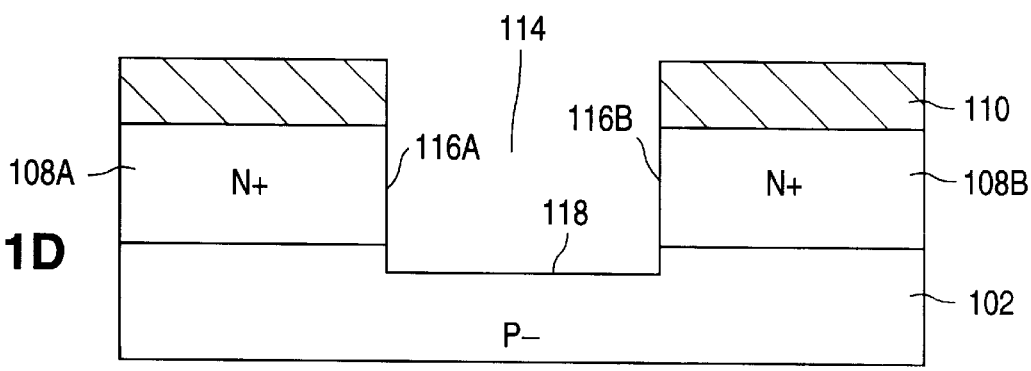

In FIG. 1D, an anisotropic etch, such as a reactive ion etch, is applied using photoresist layer 110 as an etch mask. The etch forms trench 114 completely through doped layer 108, but only partially through substrate 102. Trench 114 has opposing vertical sidewalls 116A and 116B, and planar bottom surface 118. For illustration purposes, trench 114 has a depth (or height) of 2000 angstroms and a length (between sidewalls 116A and 116B) of 4000 angstroms. The 4000 angstrom trench length represents the minimum resolution (or linewidth) of the photolithographic system. The trench splits doped layer 108 into source region 108A and drain region 108B, which will subsequently be diffused beneath bottom surface 118 as described below.

Figure 1E:
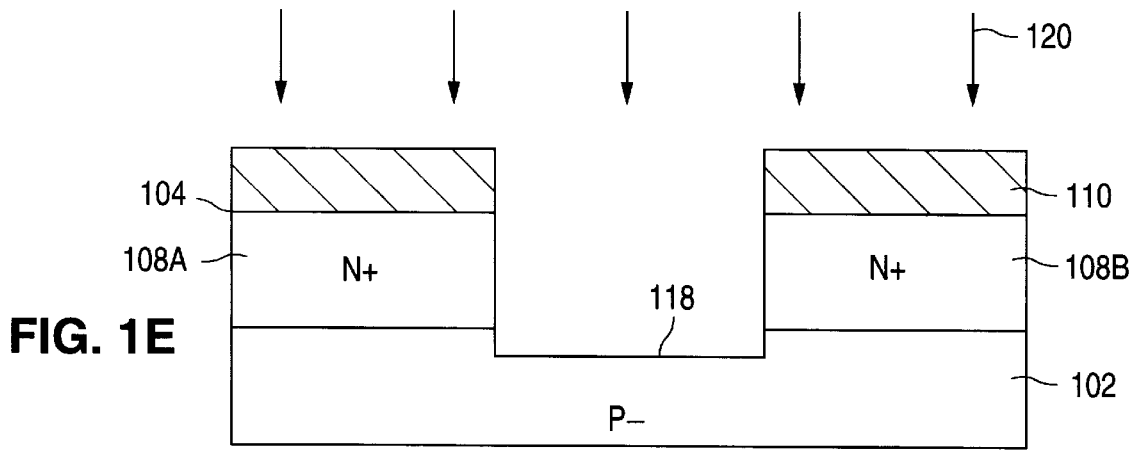

In FIG. 1E, a channel implant is provided by boron, as indicated by lines 120, which passes through bottom surface 118 using photoresist layer 10 as an implant mask for top surface 104. The channel implant includes a well implant, then a punchthrough implant, and then a threshold voltage implant. The well implant provides a more uniform background doping, the punchthrough implant provides the channel with greater robustness to punchthrough voltages, and the threshold voltage implant sets the threshold voltage of the IGFET to approximately 0.4 to 0.7 volts. The well implant is provided by boron at a dose in the range of $1\times10^{12}$ to $1\times10^{13}$ atoms/cm$^2$ and an energy in the range of 100 to 170 kiloelectron-volts, the punchthrough implant is provided by boron at a dose in the range of $1\times10^{12}$ to $1\times10^{13}$ atoms/cm$^2$ and an energy in the range of 40 to 100 kiloelectron-volts, and the threshold voltage implant is provided by boron at a dose in the range of $1\times10^{12}$ to $1\times10^{13}$ atoms/cm$^2$ and an energy in the range of 2 to 30 kiloelectron-volts. The channel implant has a boron concentration on the order of $1\times10^{17}$ atoms/cm$^3$ and provides suitable doping for a channel adjacent to bottom surface 118.

Figure 1F:
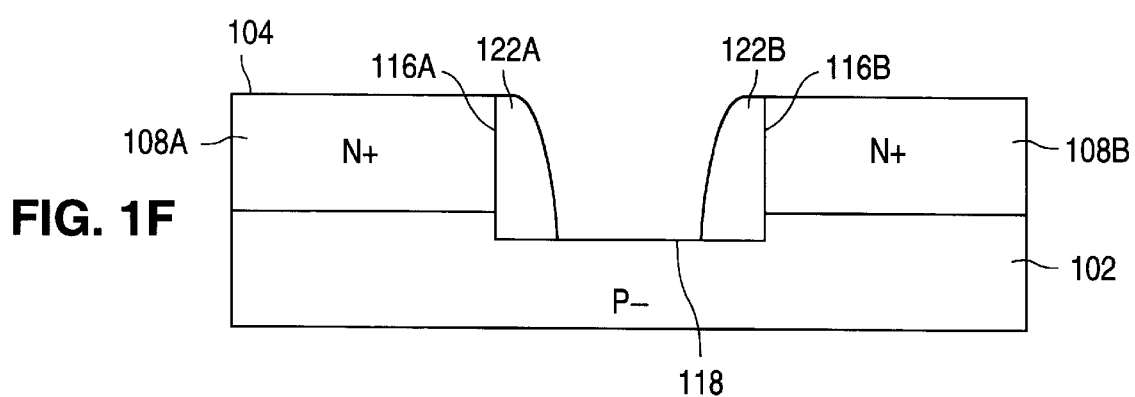

In FIG. 1F, photoresist layer 110 is stripped, a blanket layer of silicon dioxide ($SiO_2$) that is 2500 angstroms thick is deposited over substrate 102, and then an anisotropic etch, such as a reactive ion etch, is applied to the silicon dioxide layer to form oxide spacers 122A and 122B. The spacer etch is highly selective of silicon dioxide with respect to silicon, so only a negligible amount of substrate 102 is removed. Oxide spacers 122A and 122B contact and completely cover sidewalls 116A and 116B, respectively, and are aligned with top surface 104. Oxide spacers 122A and 122B also contact outer portions of bottom surface 118, adjacent to sidewalls 116A and 116B, but leave a central portion of bottom surface 118 exposed. The central portion of bottom surface 118 is symmetrically spaced between sidewalls 116A and 116B. Oxide spacers 122A and 122B each have a length of 1200 angstroms (as measured laterally from sidewalls 116A and 116B) along the outer portions of bottom surface 118. Therefore, the central portion of bottom surface 118 has a length of 1600 angstroms (4000–2400 angstroms).

The dimensions of the insulative spacers depend on several variables, including the height and length of the trench, the thickness of the blanket layer of insulative spacer material, and the duration of the spacer etch. The insulative spacer dimensions depend on the desired scaling of the trench length to the channel length. However, the channel length depends on various factors including the characteristics of the source and drain regions and a subsequent high-temperature anneal. Preferably, the length of the central portion is less than half of the trench length, and is less than 2000 angstroms. Furthermore, as described below, the channel shall be substantially aligned with the central portion of bottom surface 118 and a bottom surface of a gate electrode.

Figure 1G:
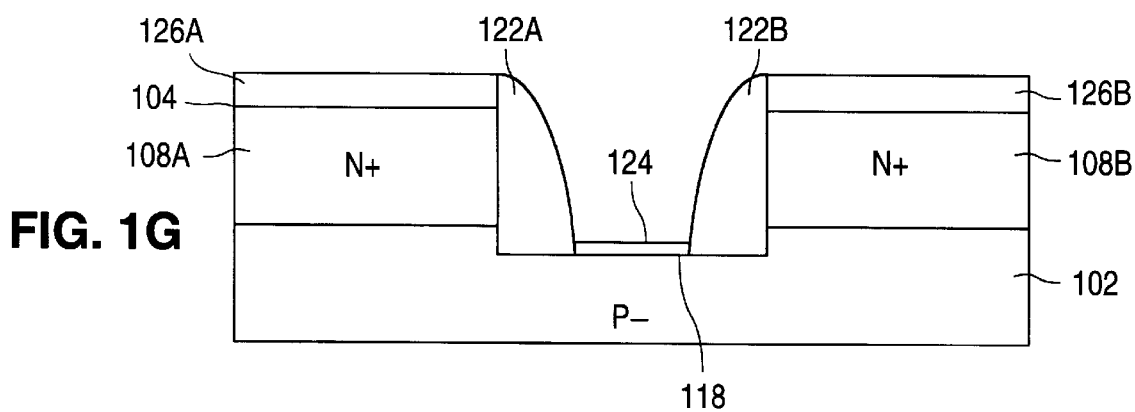

In FIG. 1G, a high quality layer of silicon dioxide thermally grown on the exposed silicon surfaces using tube growth at a temperature of 700 to 1000° C. in an $O_2$ containing ambient. As a result, gate oxide 124 with a thickness of 50 angstroms is formed on the central portion of bottom surface 118, and oxide segments 126A and 126B with a thickness of 200 angstroms are formed on top surface 104. The heights of oxide spacers 122A and 122B increase as well. Oxide segments 126A and 126B are thicker than gate oxide 124 due to the heavy doping of arsenic in source region 108A and drain region 108B, respectively. Oxide segments 126A and 126B, oxide spacers 122A and 122B and gate oxide 124 form a continuous oxide layer on substrate 102.

Figure 1H:
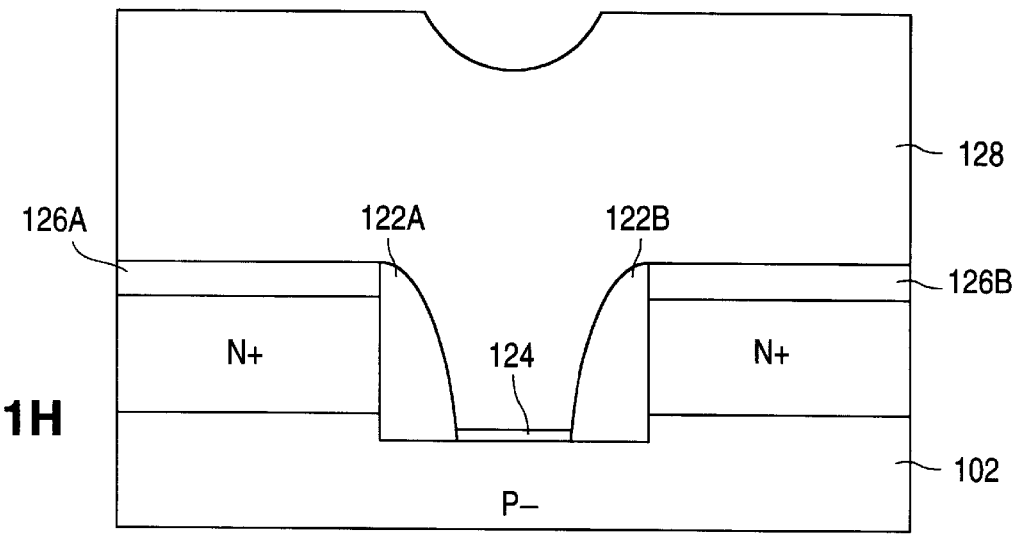

In FIG. 1H, a blanket layer of undoped polysilicon 128 with a thickness of 4000 angstroms is deposited by low pressure chemical vapor deposition over substrate 102. Polysilicon 128 contacts oxide spacers 122A and 122B, gate oxide 124 and oxide segments 126A and 126B and fills the remaining space in trench 114. Polysilicon 128 is then doped by ion implantation of arsenic at a dose in the range of $1 \times 10^{15}$ to $5 \times 10^{15}$ atoms/cm$^2$ and an energy in the range of 2 to 80 kiloelectron-volts. Polysilicon 128 is thick enough to prevent the arsenic from passing through to the underlying structure.

Figure 1I:
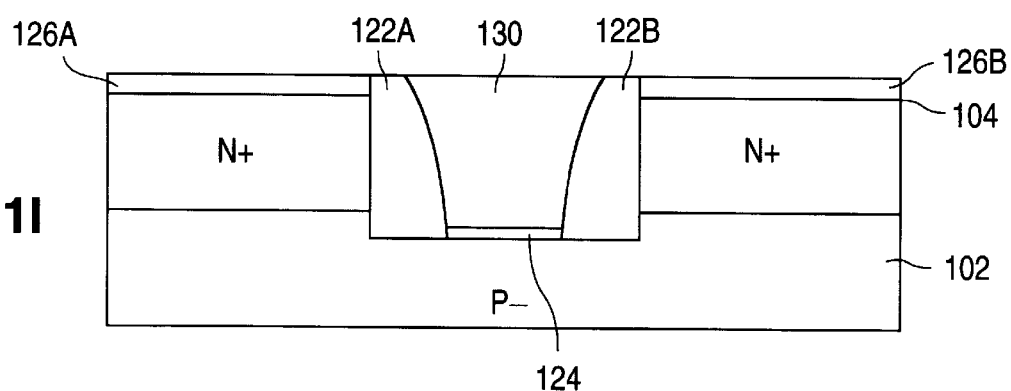

In FIG. 1I, the structure is planarized by applying chemical-mechanical polishing in the presence of an abrasive slurry that is highly selective of polysilicon with respect to silicon dioxide. The polishing grinds down polysilicon 128 along with oxide spacers 122A and 122B and oxide segments 126A and 126B above top surface 104, and then is discontinued using oxide spacers 122A and 122B and oxide segments 126A and 126B as a stop-layer. After polishing occurs, the remaining portion of polysilicon 128 forms polysilicon gate electrode 130. The top surfaces of oxide spacers 122A and 122B, oxide segments 126A and 126B, and polysilicon gate electrode 130 are aligned and form a planar surface. Polysilicon gate electrode 130 extends merely 50 angstroms above top surface 104, and therefore is substantially aligned with top surface 104. Furthermore, all of polysilicon gate electrode 130 is within the length of trench 114, and substantially all of polysilicon gate electrode 130 is within trench 114. Of importance, polysilicon gate electrode 130 is spaced from and electrically isolated from substrate 102 by oxide spacers 122A and 122B and gate oxide 124. No portion of polysilicon gate electrode 130 contacts substrate 102 or overlaps top surface 104.

Figure 1J:
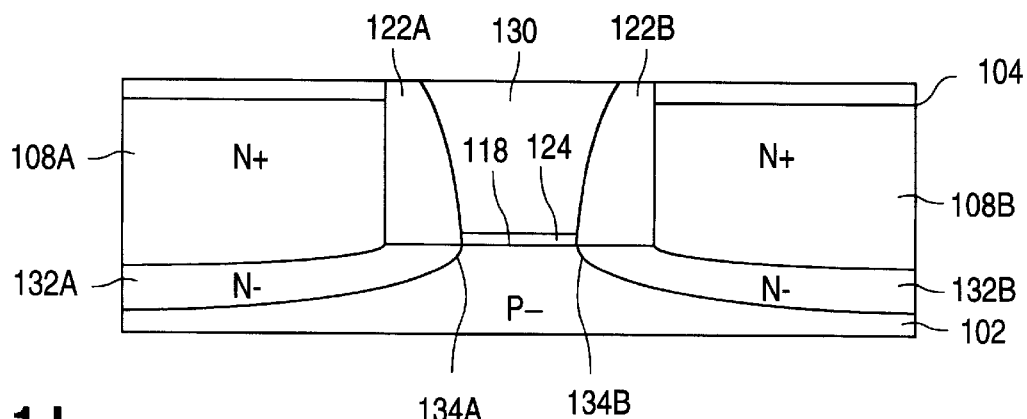

In FIG. 1J, a rapid thermal anneal on the order of 950 to 1050° C. for 10 to 30 seconds is applied to remove crystalline damage and to activate and drive-in the implanted dopants. In source region 108A and drain region 108B, the phosphorus diffuses far more rapidly than the arsenic. Also, as mentioned above, source region 108A and drain region 108B are graded so that the deepest regions are the most lightly doped. As a result, lightly doped source region 132A and lightly doped drain region 132B diffuse from source region 108A and drain region 108B respectively, diffuse beneath trench 114, and are adjacent to the outer portions of bottom surface 118 beneath oxide spacers 122A and 122B, respectively. Lightly doped source and drain regions 132A and 132B are doped N−, with a phosphorus concentration on the order of $5 \times 10^{17}$ to $5 \times 10^{18}$ atoms/cm$^3$ since the diffusion is provided mainly by phosphorus (a rapid diffuser) without arsenic (a slow diffuser). Furthermore, source region 108A and drain region 108B remain heavily doped near top surface 104 to facilitate forming low-resistance source and drain contacts, respectively. Advantageously, lightly doped source and drain regions 132A and 132B do not diffuse any substantial amount beneath the central portion of bottom surface 118 (beneath gate oxide 124 and the bottom surface of polysilicon gate electrode 130), but instead form channel junctions 134A and 134B, respectively, that are substantially aligned with the central portion of bottom surface 118. In other words, junction 134A is substantially aligned with a first side of polysilicon gate electrode 130 where it contacts gate oxide 124, and junction 134B is substantially aligned with a second side of polysilicon gate electrode 130 where it contacts gate oxide 124. Thus, junctions 134A and 134B define a channel, substantially aligned with the bottom surface of gate electrode 130, with a length of approximately 1600 angstroms, for an N-channel MOSFET controlled by polysilicon gate electrode 130 that includes a source provided by source regions 108A and 132A, and a drain provided by drain regions 108B and 132B.

FIGS. 2A–2J show cross-sectional views of successive process steps for forming an IGFET with a gate electrode and insulative spacers in a trench in accordance with a second embodiment of the invention. It may be desirable to form the gate insulator and/or sidewall insulators before the insulative spacers are formed. If, for instance, a gate oxide is formed before oxide spacers are formed, then it is difficult or impossible to apply the spacer etch and form the oxide spacers without removing the gate oxide. However, if the insulative spacers are another material, and the spacer etch is highly selective of the insulative spacers with respect to the gate oxide, then the spacer etch need not remove the gate oxide. The primary difference between the second embodiment and the first embodiment is that in the second embodiment, the gate oxide is formed before the insulative spacers are formed, the insulative spacers are silicon nitride, and the spacer etch does not remove the gate oxide. Unless otherwise noted, the elements for the second embodiment (e.g., substrate 202, gate oxide 224, etc.) are similar to elements of the first embodiment (e.g., substrate 102, gate oxide 124, etc.), and the description of related elements and process steps need not be repeated.

Figure 2A:
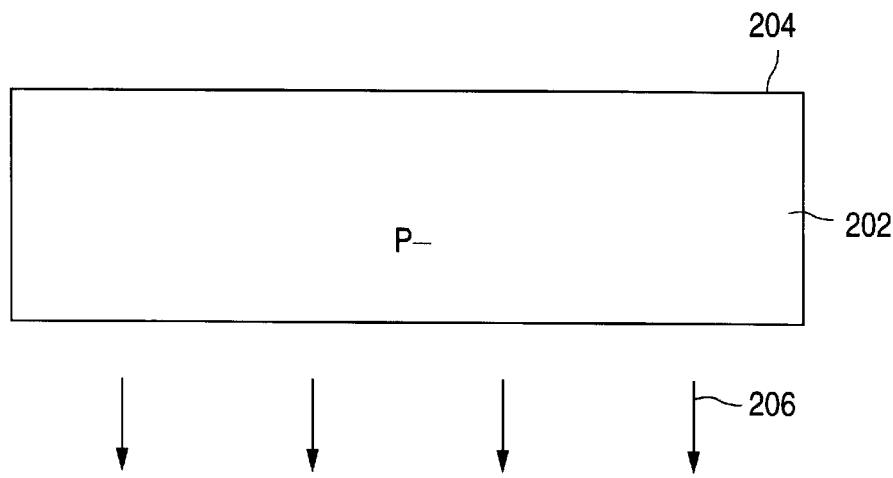
FIGS. 2A–2J show cross-sectional views of successive process steps for forming an IGFET with a gate electrode and insulative spacers in a trench in accordance with a second embodiment of the invention.

In FIG. 2A, semiconductor substrate 202 suitable for integrated circuit manufacture is provided. Substrate 202 includes a P− epitaxial surface layer with a planar top surface 204.

Figure 2B:
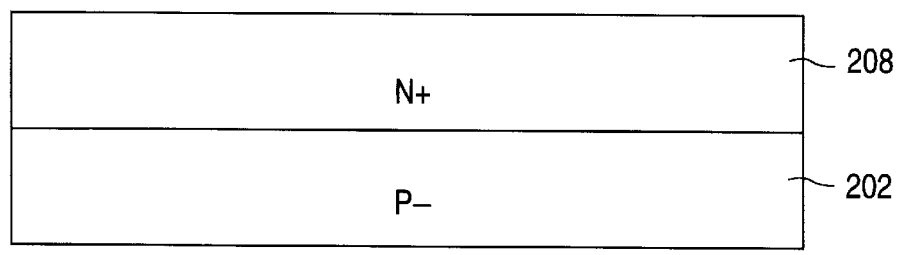

In FIG. 2B, N+ doped layer 208 is implanted into substrate 202 by subjecting the structure to ion implantation of phosphorus and arsenic, as indicated by arrows 206.

Figure 2C:
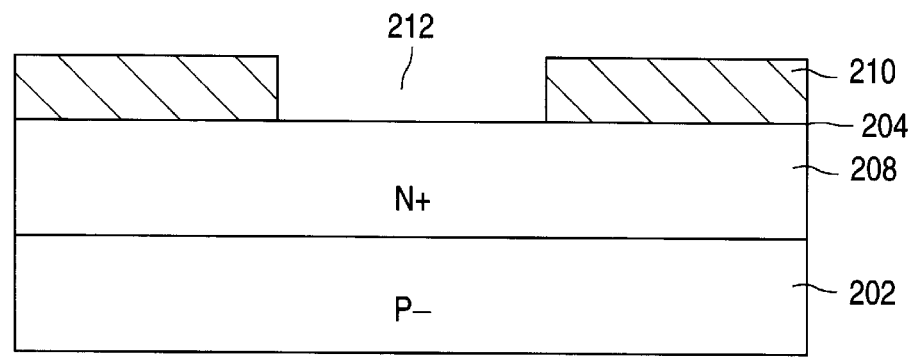

In FIG. 2C, photoresist layer 210 is deposited as a continuous layer on top surface 204 and then selectively irradiated using a step and repeat system. Thereafter, photoresist layer 210 is developed and the irradiated portions are removed to provide opening 212 that defines the lateral boundaries for a trench.

Figure 2D:
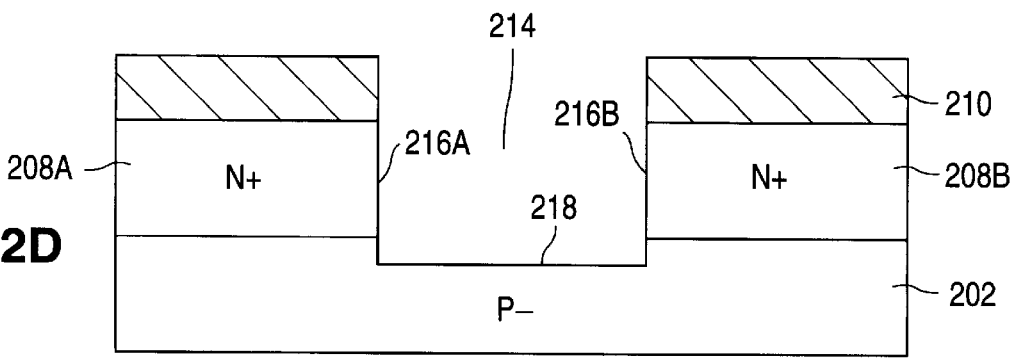

In FIG. 2D, an anisotropic etch is applied using photoresist layer 210 as an etch mask to form trench 214 completely through doped layer 208 and partially through substrate 202. Trench 214 includes opposing vertical sidewalls 216A and 216B, and planar bottom surface 218. Trench 214 splits doped layer 208 into source region 208A and drain region 208B.

Figure 2E:
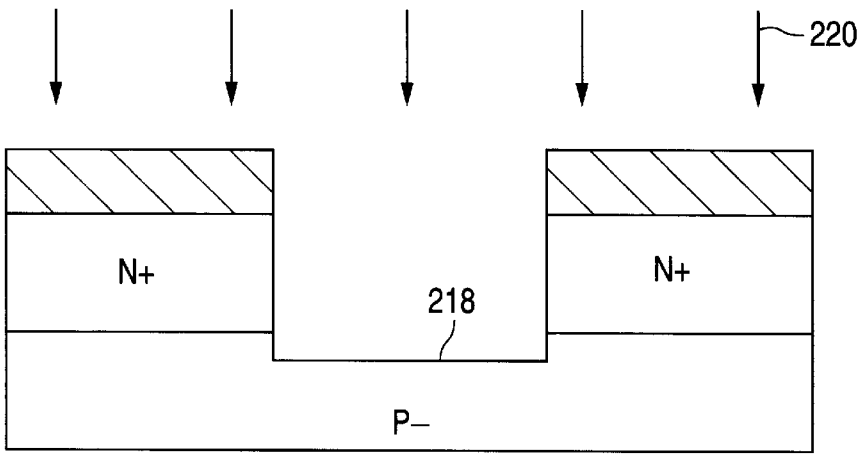

In FIG. 2E, a channel implant through bottom surface 218 is provided by subjecting the structure to ion implantation of boron, as indicated by arrows 220.

Figure 2F:
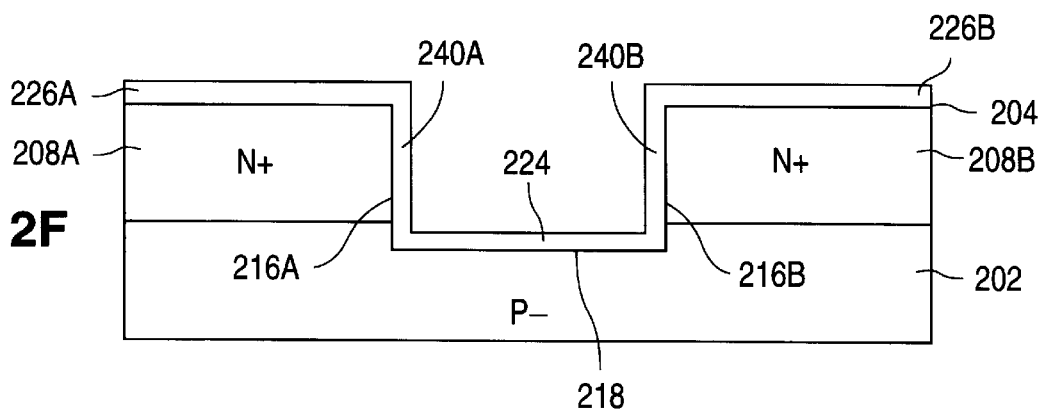

In FIG. 2F, photoresist layer 210 is stripped, and an oxide layer is thermally grown on substrate 202. The oxide layer includes gate oxide 224 on bottom surface 218, sidewall oxides 240A and 240B on sidewalls 216A and 216B, respectively, and oxide segments 226A and 226B on top surface 204. Sidewall oxides 240A and 240B each have a length of 200 angstroms along bottom surface 218 due to the heavy doping of arsenic in source region 208A and drain region 208B, respectively.

Figure 2G:
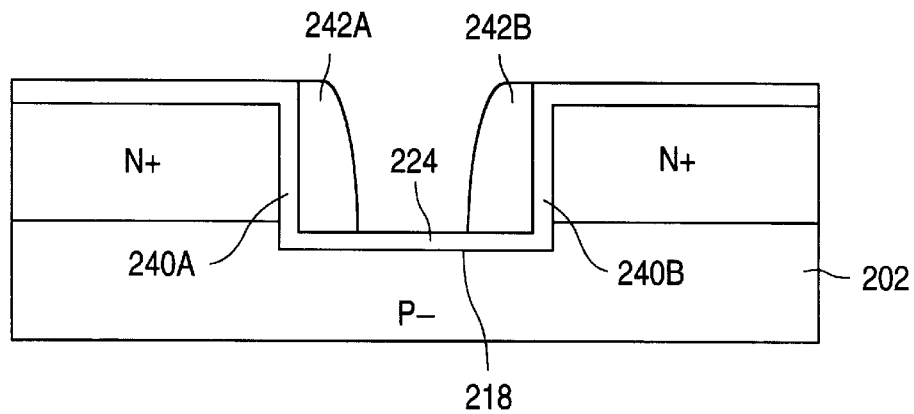

In FIG. 2G, a blanket layer of silicon nitride ($Si_3N_4$) is conformally deposited over substrate 202, and then an anisotropic etch, such as a reactive ion etch, is applied to the nitride layer form nitride spacers 242A and 242B on sidewall oxides 240A and 240B, respectively, and on outer portions of gate oxide 224 adjacent to sidewall oxides 240A and 240B, respectively. Accordingly, nitride spacers 242A and 242B are formed in trench 214 but do not contact substrate 202. Nitride spacers 242A and 242B each have a length of 1000 angstroms along the outer portions of gate oxide 224 and leave exposed a central portion of gate oxide 224 above a central portion of bottom surface 218. The spacer etch is highly selective of silicon nitride with respect to silicon dioxide, and therefore the central portion of gate oxide 224 is mostly intact. However, if desired, after the spacer etch, thermal oxidation can be applied to increase the thickness of the central portion of gate oxide 224.

Figure 2H:
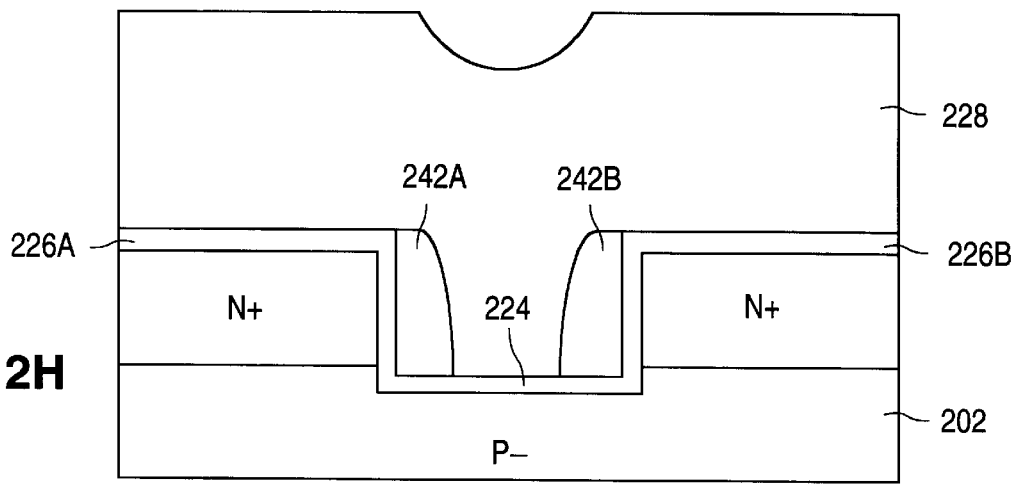

In FIG. 2H, a blanket layer of undoped polysilicon 228 is deposited over substrate 202. Polysilicon 228 contacts nitride spacers 242A and 242B, gate oxide 224 and oxide segments 226A and 226B and fills the remaining space in trench 214. Polysilicon 228 is then doped.

Figure 2I:
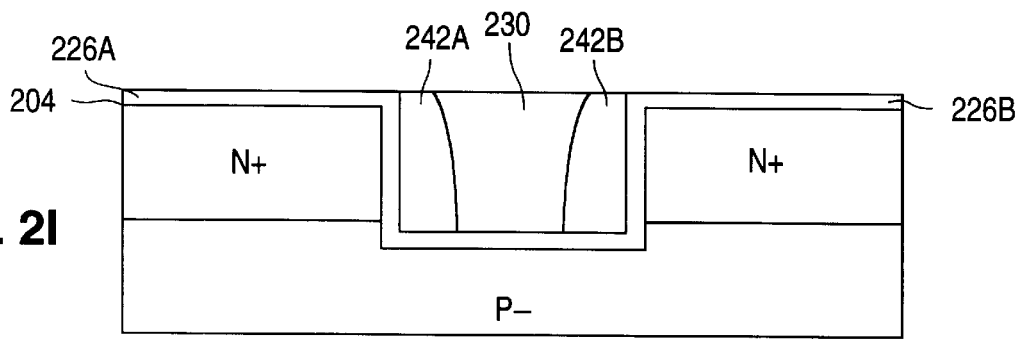

In FIG. 2I, the structure is planarized by applying chemical-mechanical polishing in the presence of an abrasive slurry that is highly selective of polysilicon with respect to silicon dioxide. The polishing grinds down regions of polysilicon 228, but is discontinued before reaching top surface 204. The remaining portion of polysilicon 228 forms polysilicon gate electrode 230, which is aligned with nitride spacers 242A and 242B and oxide segments 226A and 226B. Polysilicon gate electrode 230 is substantially aligned with top surface 204, and substantially all of polysilicon gate electrode 230 is within trench 214.

Figure 2J:
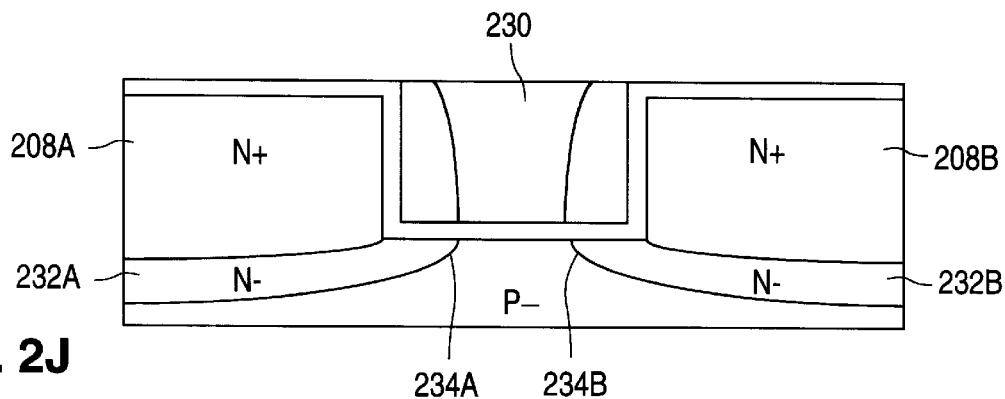

In FIG. 2J, a rapid thermal anneal on the order of 950 to 1050° C. for 10 to 30 seconds is applied to remove crystalline damage and to activate and drive-in the implanted dopants. As a result, lightly doped source and drain regions 232A and 232B diffuse from source and drain regions 208A and 208B, respectively, and form channel junctions 234A and 234B, respectively, that are substantially aligned with the bottom surface of polysilicon gate electrode 230.

FIGS. 3A–3K show cross-sectional views of successive process steps for forming an IGFET with a gate electrode and insulative spacers in a trench in accordance with a third embodiment of the invention. It may be desirable to implant the source and the drain after the trench has been formed, or for that matter, after the polysilicon gate has been formed. For instance, implanting the source and the drain after forming an undoped polysilicon gate electrode can serve to dope the polysilicon gate electrode as well. The primary difference between the third embodiment and the first embodiment is that in the third embodiment, the source and drain are implanted after the polysilicon gate electrode is formed, using the polysilicon gate electrode and the insulative spacers as an implant mask for the bottom surface of the trench. Unless otherwise noted, the elements for the third embodiment (e.g., substrate 302, gate oxide 324, etc.) are similar to elements of the first embodiment (e.g., substrate 102, gate oxide 124, etc.), and the description of related elements and process steps need not be repeated.

Figure 3A:
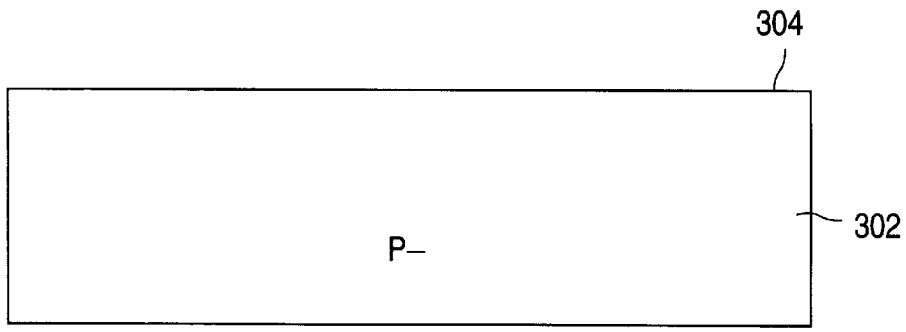
FIGS. 3A–3J show cross-sectional views of successive process steps for forming an IGFET with a gate electrode and insulative spacers in a trench in accordance with a third embodiment of the invention.

In FIG. 3A, semiconductor substrate 302 suitable for integrated circuit manufacture is provided. Substrate 302 includes a P– epitaxial surface layer with a planar top surface 304.

Figure 3B:
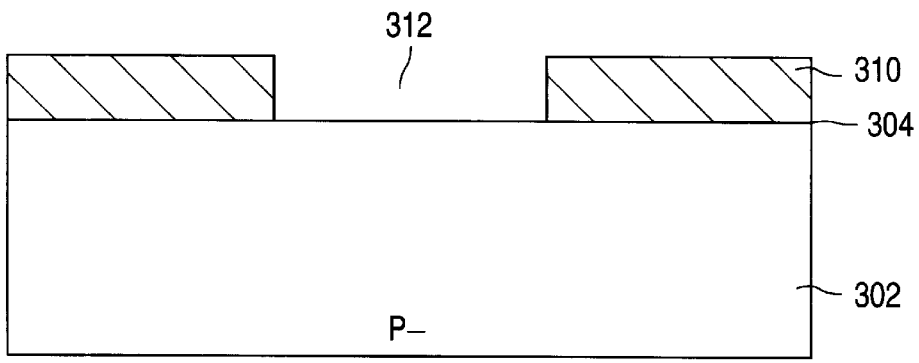

In FIG. 3B, photoresist layer 310 is deposited as a continuous layer on top surface 304 and then selectively irradiated using a step and repeat system. Thereafter, photoresist layer 310 is developed and the irradiated portions are removed to provide opening 312 that defines the lateral boundaries for a trench.

Figure 3C:
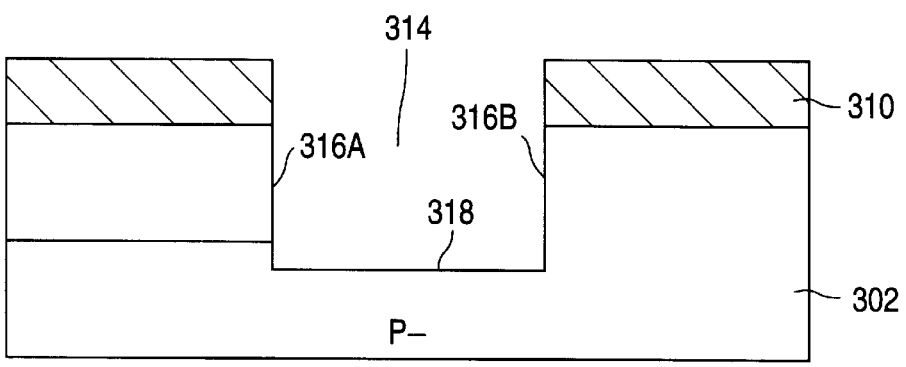

In FIG. 3C, an anisotropic etch is applied using photoresist layer 310 as an etch mask to form trench 314 partially through substrate 302. Trench 314 includes opposing vertical sidewalls 316A and 316B, and planar bottom surface 318.

Figure 3D:
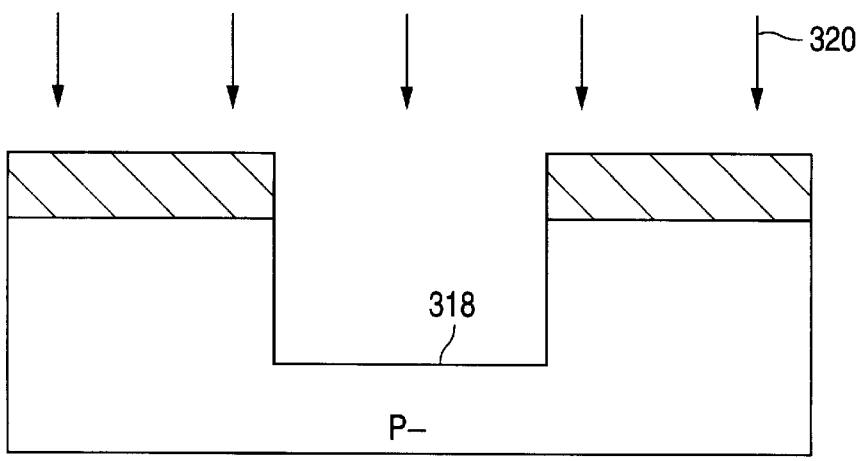

In FIG. 3D, a channel implant through bottom surface 318 is provided by subjecting the structure to ion implantation of boron, as indicated by arrows 320.

Figure 3E:
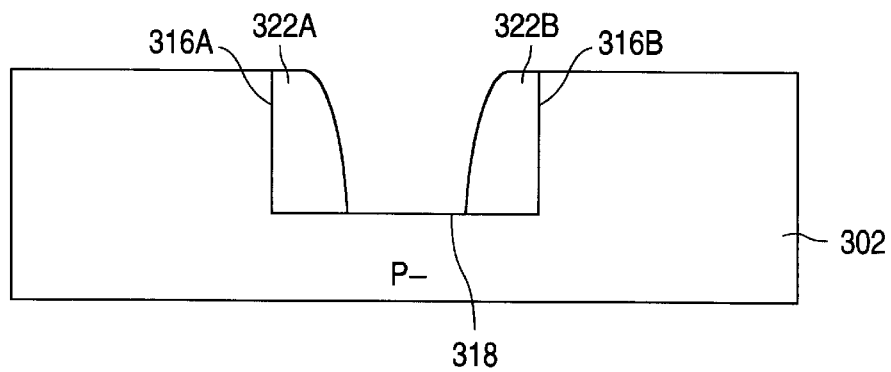

In FIG. 3E, photoresist layer 310 is stripped, a blanket layer of silicon dioxide is conformally deposited over substrate 302, and then an anisotropic etch is applied to form oxide spacers 322A and 322B on sidewalls 316A and 316B, respectively, and on outer portions of bottom surface 318. Oxide spacers 322A and 322B leave exposed a central portion of bottom surface 318.

Figure 3F:
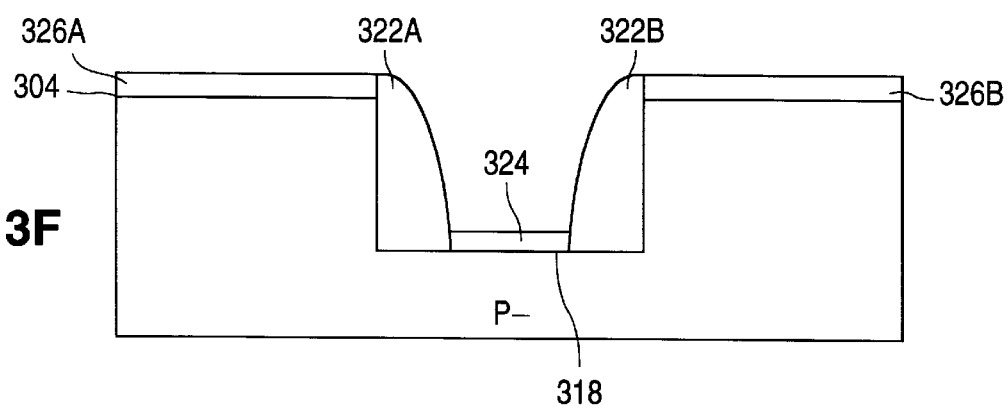

In FIG. 3F, gate oxide 324 is grown on the central portion of bottom surface 318, and oxide segments 326A and 326B are grown on top surface 304. Oxide segments 326A and 326B have similar thickness as gate oxide 324 since the sidewall source and drain regions have yet to be implanted. The heights of oxide spacers 322A and 322B increase as well.

Figure 3G:
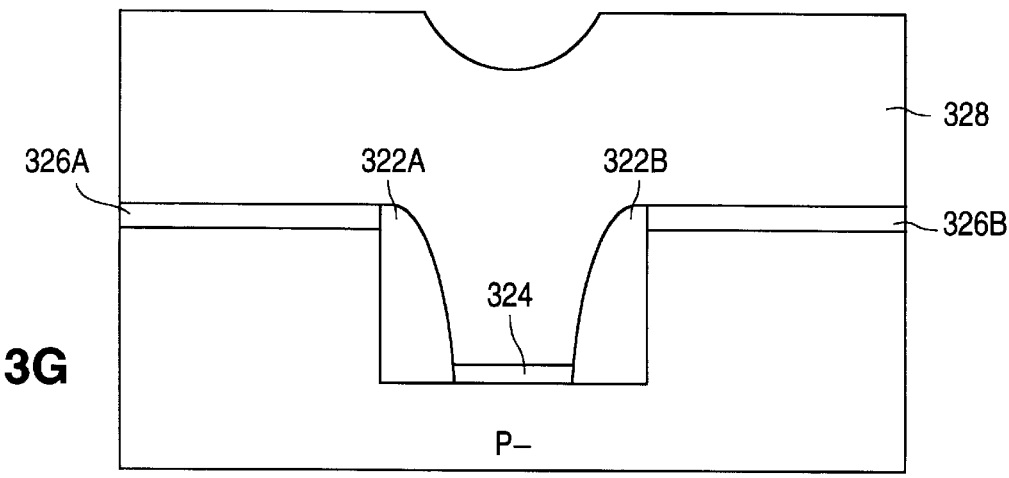

In FIG. 3G, a blanket layer of undoped polysilicon 328 is deposited over substrate 302. Polysilicon 328 contacts oxide spacers 322A and 322B, gate oxide 324 and oxide segments 326A and 326B and fills the remaining space in trench 314. Polysilicon 328 is left undoped.

Figure 3H:
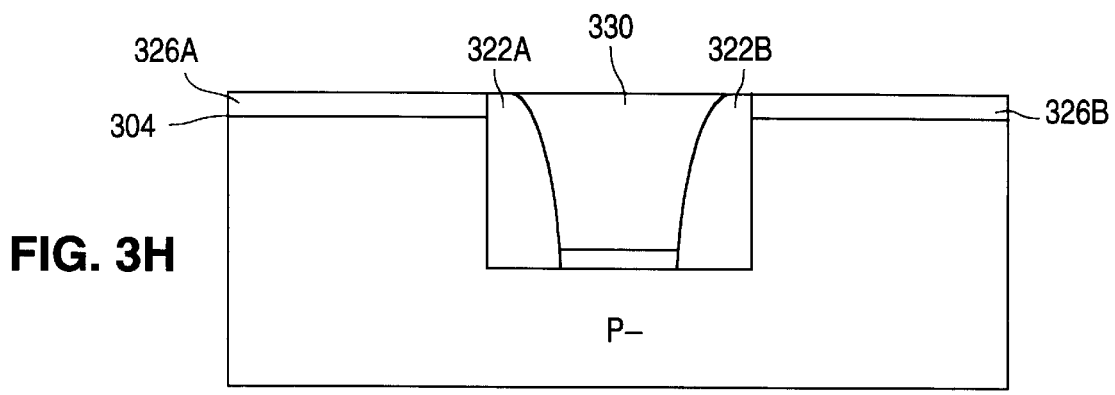

In FIG. 3H, the structure is planarized by applying chemical-mechanical polishing in the presence of an abrasive slurry that is highly selective of polysilicon with respect to silicon dioxide. The polishing grinds down regions of polysilicon 328, but is discontinued before reaching top surface 304. The remaining portion of polysilicon 328 forms polysilicon gate electrode 330, which is aligned with oxide spacers 322A and 322B and oxide segments 326A and 326B. Polysilicon gate electrode 330 is substantially aligned with top surface 304, and substantially all of polysilicon gate electrode 330 is within trench 314.

Figure 3I:
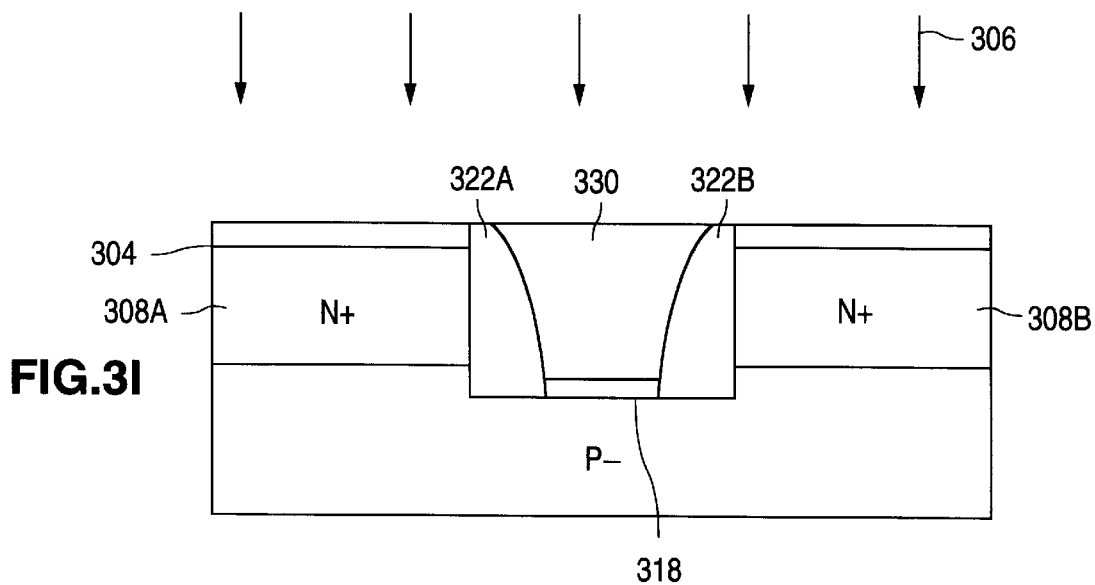

In FIG. 3I, source region 308A and drain region 308B are implanted through top surface 304 by subjecting the structure to ion implantation of phosphorus and arsenic, as indicated by arrows 306, using polysilicon gate electrode 330 and oxide spacers 322A and 322B as an implant mask for bottom surface 318. Source region 308A and drain region 308B are doped N+, moreover, the implantation provides heavy doping for polysilicon gate electrode 330.

Figure 3J:
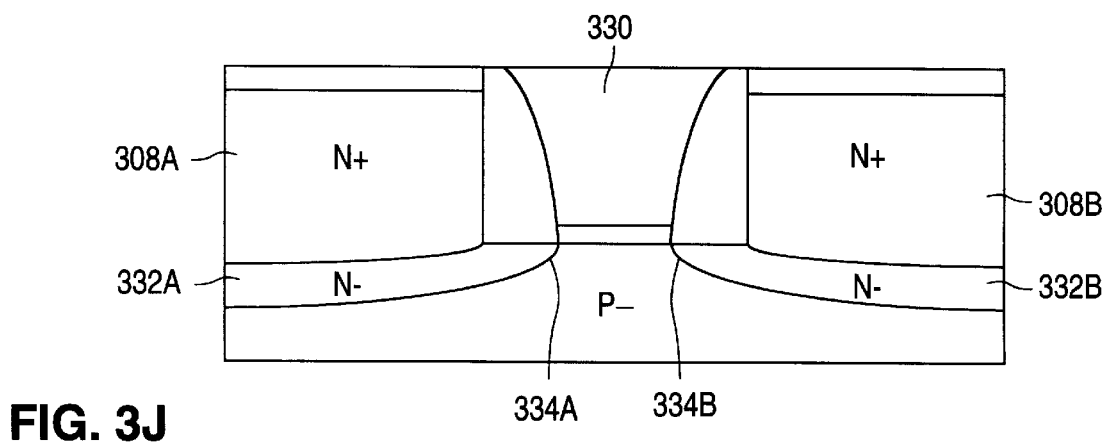

In FIG. 3J, a rapid thermal anneal on the order of 950 to 1050° C. for 10 to 30 seconds is applied to remove crystalline damage and to activate and drive-in the implanted dopants. As a result, lightly doped source and drain regions 332A and 332B diffuse from source and drain regions 308A and 308B, respectively, and form channel junctions 334A and 334B, respectively, that are substantially aligned with the bottom surface of polysilicon gate electrode 330.

FIGS. 4A–4J show cross-sectional views of successive process steps for forming an IGFET with a gate electrode and insulative spacers in a trench in accordance with a fourth embodiment of the invention. It may desirable to implant the source and drain regions to a greater depth than the bottom surface of the trench, particularly if the implanted source and drain regions may not diffuse far enough to form channel junctions substantially aligned with the bottom surface of the gate electrode. The primary difference between the fourth embodiment and the first embodiment is that in the fourth embodiment, the doped layer is implanted deeper than the trench, the channel implant counterdopes the doped layer beneath the central portion of the bottom surface using the insulative spacers as an implant mask, and the doped layer diffuses only slightly. Unless otherwise noted, the elements for the fourth embodiment (e.g., substrate 402, gate oxide 424, etc.) are similar to elements of the first embodiment (e.g., substrate 102, gate oxide 124, etc.), and the description of related elements and process steps need not be repeated.

Figure 4A:
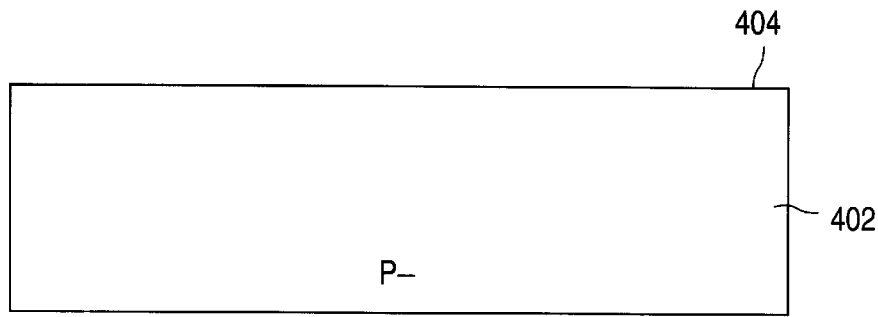
FIGS. 4A–4J show cross-sectional views of successive process steps for forming an IGFET with a gate electrode and insulative spacers in a trench in accordance with a fourth embodiment of the invention.

In FIG. 4A, semiconductor substrate 402 suitable for integrated circuit manufacture is provided. Substrate 202 includes a P− epitaxial surface layer with a planar top surface 404.

Figure 4B:
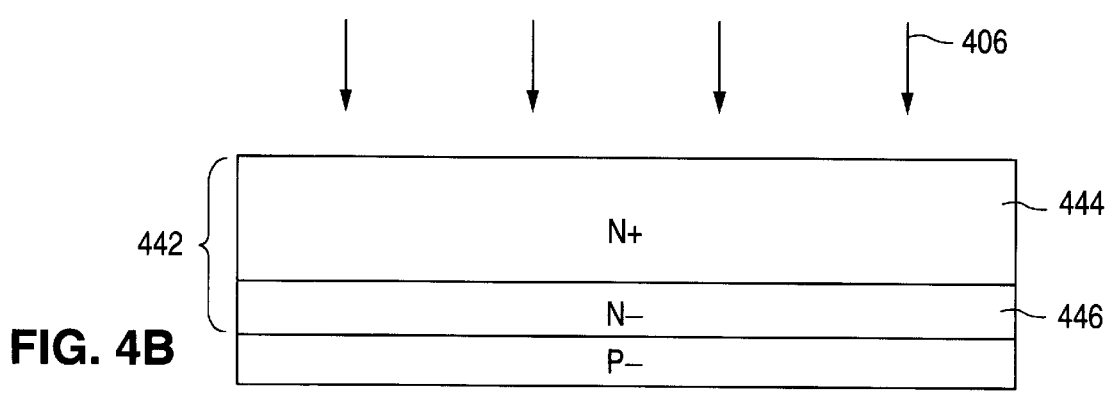

In FIG. 4B, substrate 402 is subjected to ion implantation of arsenic, indicated by arrows 440, at a first dosage in the range of $1 \times 10^{15}$ to $5 \times 10^{15}$ atoms/cm$^2$ at a first energy of about 30 kiloelectron-volts, and a second dosage in the range of $1 \times 10^{13}$ to $5 \times 10^{14}$ atoms/cm$^2$ at a second energy of about 60 kiloelectron-volts. This forms doped layer 442, consisting of N+ doped upper layer 444 with an arsenic concentration in the range of $1 \times 10^{20}$ to $1 \times 10^{21}$ atoms/cm$^3$ and a depth of 1800 angstroms below top surface 404, and N− doped lower layer 446 with an arsenic concentration in the range of $5 \times 10^{17}$ to $5 \times 10^{18}$ atoms/cm$^3$ and a depth of 500 angstroms below doped upper layer 444. Doped layer 442 differs from doped layer 108 in several respects. First, doped layer 442 is deeper than doped layer 108 by 500 angstroms. Second, doped layer 442 is doped solely by arsenic. Third, doped layer 442 includes a heavily doped upper layer above a lightly doped lower layer.

Figure 4C:
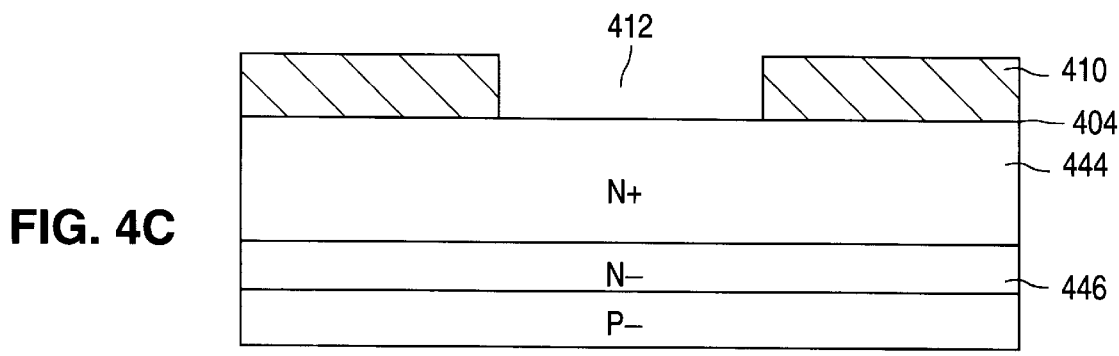

In FIG. 4C, photoresist layer 410 is deposited as a continuous layer on top surface 404 and then selectively irradiated using a step and repeat system. Thereafter, photoresist layer 410 is developed and the irradiated portions are removed to provide opening 412 that defines the lateral boundaries for a trench.

Figure 4D:
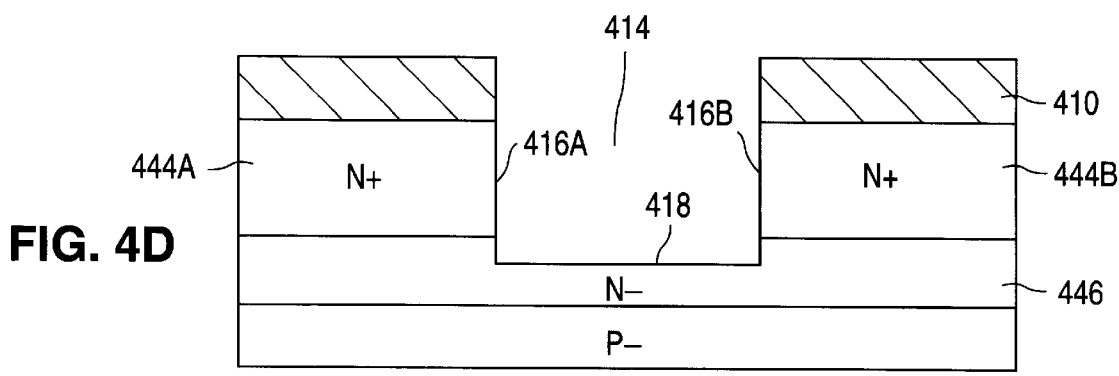

In FIG. 4D, an anisotropic etch is applied using photoresist layer 410 as an etch mask to form trench 414 completely through doped upper layer 444, partially through doped lower layer 446, and thus partially through substrate 402. Trench 414 includes opposing vertical sidewalls 416A and 416B, and planar bottom surface 418. Trench 414 splits doped upper layer 444 into heavily doped source region 444A and heavily doped drain region 444B.

Figure 4E:
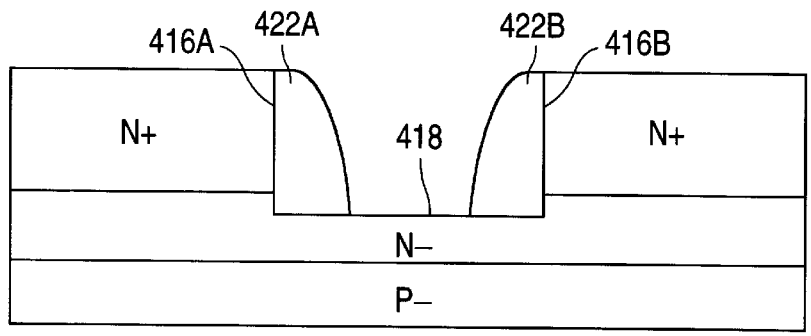

In FIG. 4E, photoresist layer 410 is stripped, a blanket layer of silicon dioxide is conformally deposited over substrate 402, and then an anisotropic etch is applied to form oxide spacers 422A and 422B on sidewalls 416A and 416B, respectively, and on outer portions of bottom surface 418. Oxide spacers 422A and 422B leave exposed a central portion of bottom surface 418.

Figure 4F:
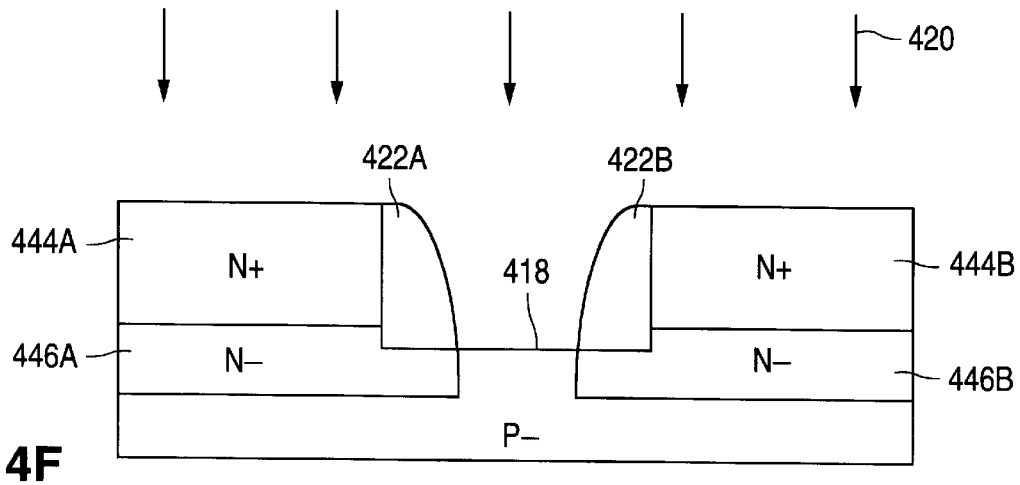

In FIG. 4F, a channel implant is provided by subjecting the structure to ion implantation of boron, as indicated by arrows 420. The channel implant differs from the channel implant in the first embodiment in several respects. First, the channel implant does not pass through all of bottom surface 418, instead, oxide spacers 422A and 422B provide an implant mask for the outer portions of bottom surface 418, and the channel implant passes through only the central portion of bottom surface 418. Second, the channel implant counterdopes doped lower layer 446 beneath the central portion of bottom surface 418, effectively splitting doped lower layer 446 into lightly doped source region 446A and lightly doped drain region 446B. Third, the boron dosage is about twice the boron dosage used in the first embodiment to assure adequate counterdoping of doped lower layer 446 beneath the central portion of bottom surface 418. Fourth, the boron is also implanted into heavily doped source and drain regions 444A and 444B, but lacks sufficient concentration to counterdope these regions.

Figure 4G:
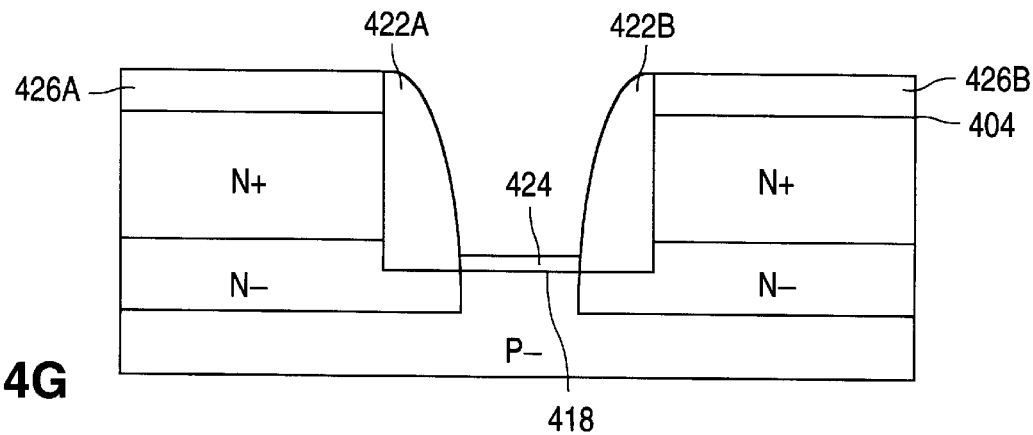

In FIG. 4G, gate oxide 424 is grown on the central portion of bottom surface 418, and oxide segments 426A and 426B are grown on top surface 404. The heights of oxide spacers 422A and 422B increase as well.

Figure 4H:
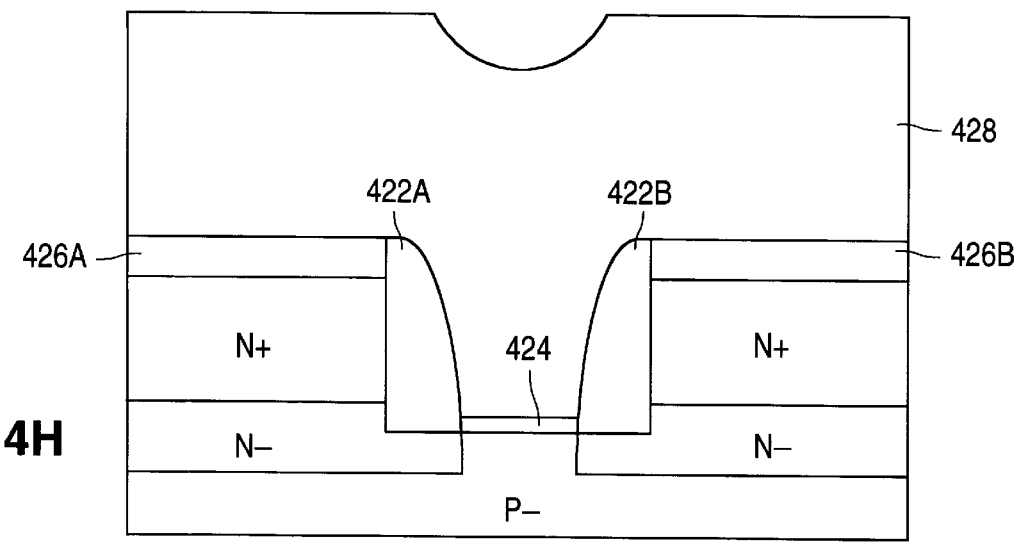

In FIG. 4H, a blanket layer of undoped polysilicon 428 is deposited over substrate 402. Polysilicon 428 contacts oxide spacers 422A and 422B, gate oxide 424 and oxide segments 426A and 426B and fills the remaining space in trench 414. Polysilicon 428 is then doped.

Figure 4I:
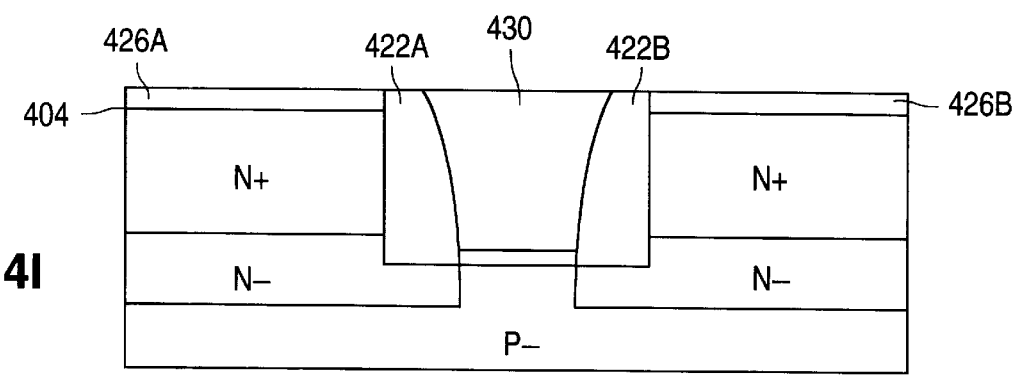

In FIG. 4I, the structure is planarized by applying chemical-mechanical polishing in the presence of an abrasive slurry that is highly selective of polysilicon with respect to silicon dioxide. The polishing grinds down regions of polysilicon 428, but is discontinued before reaching top surface 404. The remaining portion of polysilicon 428 forms polysilicon gate electrode 430, which is aligned with oxide spacers 422A and 422B and oxide segments 426A and 426B. Polysilicon gate electrode 430 is substantially aligned with top surface 404, and substantially all of polysilicon gate electrode 430 is within trench 414.

Figure 4J:
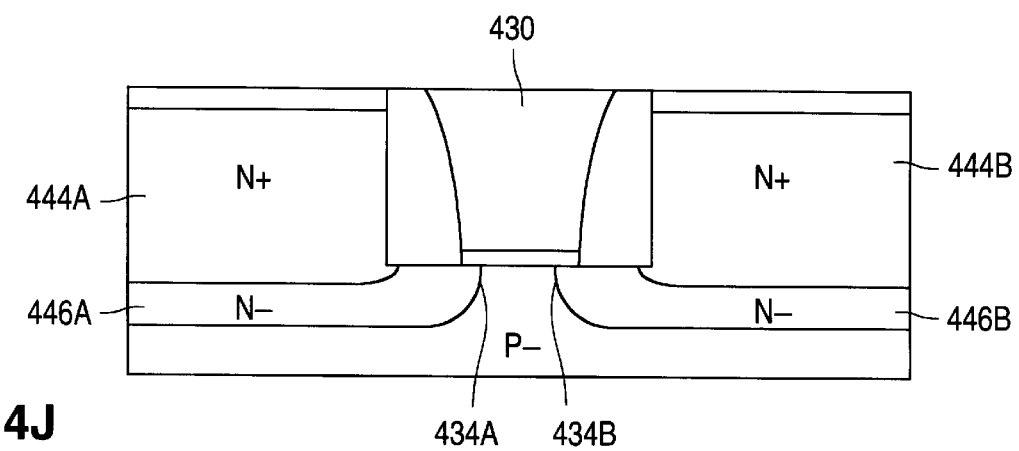

In FIG. 4J, a rapid thermal anneal on the order of 950 to 1050° C. for 10 to 30 seconds is applied to remove crystalline damage and to activate and drive-in the implanted dopants. Since heavily doped and lightly doped source and drain regions 444A, 444B, 446A and 446B are doped solely by arsenic, very little diffusion occurs. As a result, lightly doped source and drain regions 446A and 446B form channel junctions 434A and 434B, respectively, that are substantially aligned with the bottom surface of polysilicon gate electrode 430.

FIGS. 5A–5K show cross-sectional views of successive process steps for forming an IGFET with a gate electrode and insulative spacers in a trench in accordance with a fifth embodiment of the invention. It may desirable to implant lightly doped source and drain regions through the bottom surface of the trench, particularly if heavily doped source and drain regions may not diffuse far enough to form channel junctions substantially aligned with the bottom surface of the gate electrode. The primary difference between the fifth embodiment and the first embodiment is that in the fifth embodiment, a lightly doped layer is implanted through the bottom surface of the trench, the channel implant counterdopes the lightly doped layer beneath the central portion of the bottom surface using the insulative spacers as an implant mask, and the source and drain regions diffuse only slightly. Unless otherwise noted, the elements for the fifth embodiment (e.g., substrate 502, gate oxide 524, etc.) are similar to elements of the first embodiment (e.g., substrate 102, gate oxide 124, etc.), and the description of related elements and process steps need not be repeated.

Figure 5A:
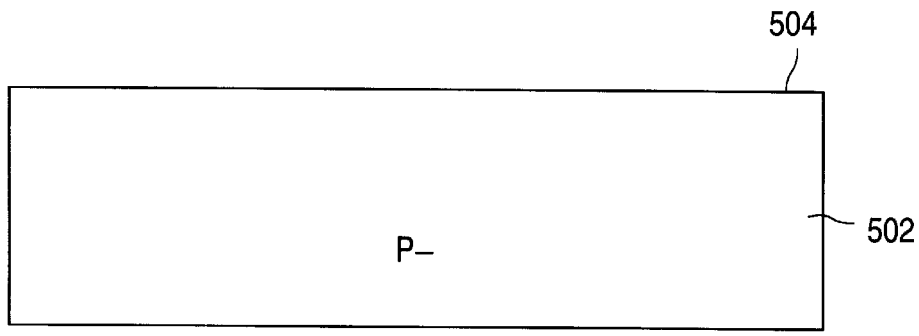
FIGS. 5A–5K show cross-sectional views of successive process steps for forming an IGFET with a gate electrode and insulative spacers in a trench in accordance with a fifth embodiment of the invention.

In FIG. 5A, semiconductor substrate 502 suitable for integrated circuit manufacture is provided. Substrate 502 includes a P− epitaxial surface layer with a planar top surface 504.

Figure 5B:
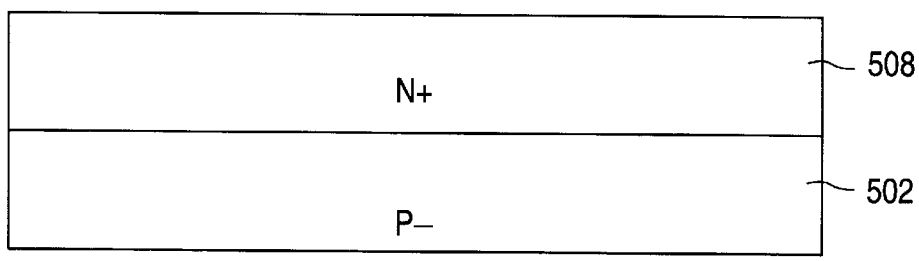

In FIG. 5B, doped layer 508 is implanted into substrate 502 by subjecting the structure to ion implantation of arsenic, as indicated by arrows 506. Doped layer 508 differs from doped layer 108 in that doped layer 508 is doped solely by arsenic, instead of arsenic and phosphorus.

Figure 5C:
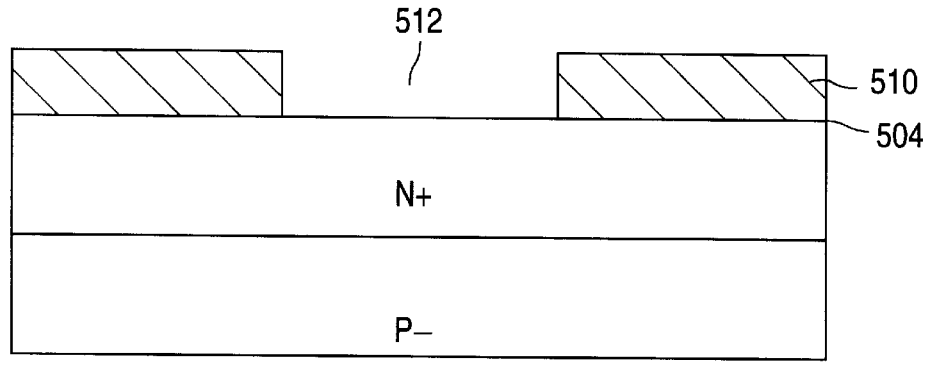

In FIG. 5C, photoresist layer 510 is deposited as a continuous layer on top surface 504 and then selectively irradiated using a step and repeat system. Thereafter, photoresist layer 510 is developed and the irradiated portions are removed to provide opening 512 that defines the lateral boundaries for a trench.

Figure 5D:
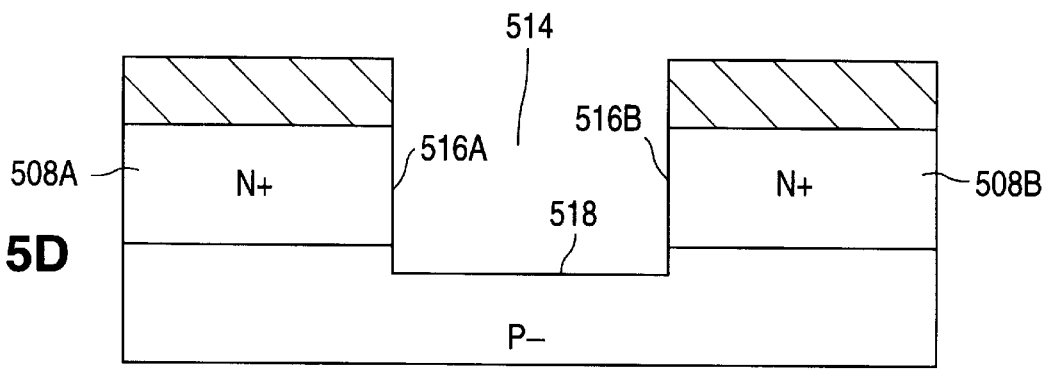

In FIG. 5D, an anisotropic etch is applied using photoresist layer 510 as an etch mask to form trench 514 completely through doped layer 508 and partially through substrate 502. Trench 514 includes opposing vertical sidewalls 516A and 516B, and planar bottom surface 518. Trench 514 splits doped layer 508 into heavily doped source and drain regions 508A and 508B.

Figure 5E:
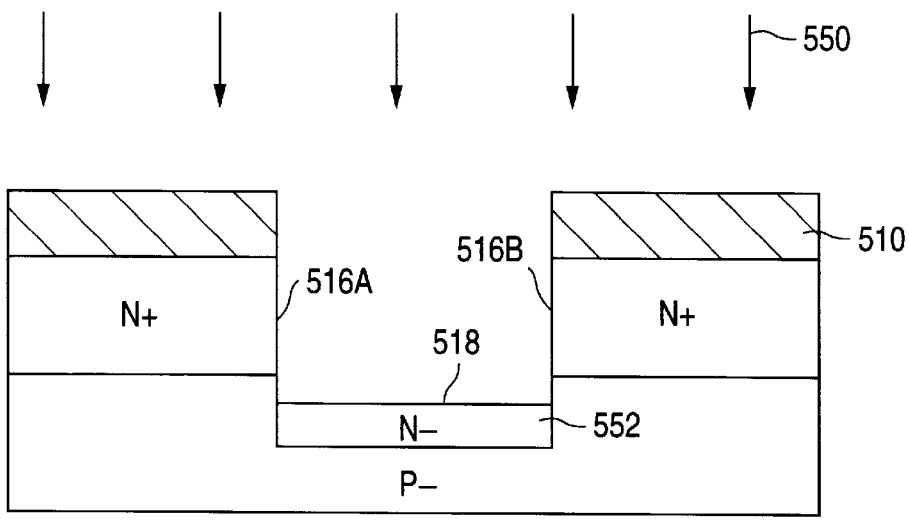

In FIG. 5E, substrate 502 is subjected to an ion implant of arsenic, indicated by arrows 550, at a dosage in the range of $1 \times 10^{13}$ to $5 \times 10^{14}$ atoms/cm$^2$ and an energy in the range of 2 to 80 kiloelectron-volts using photoresist layer 510 as an implant mask. This forms N− doped layer 552 in substrate 502 beneath and adjacent to the bottom surface 518. Doped layer 552 is substantially aligned with sidewalls 516A and 516B.

Figure 5F:
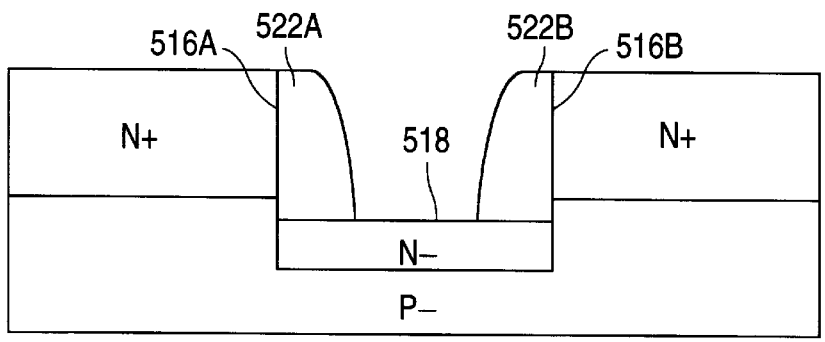

In FIG. 5F, photoresist layer 510 is stripped, a blanket layer of silicon dioxide is conformally deposited over substrate 502, and then an anisotropic etch is applied to form oxide spacers 522A and 522B on sidewalls 516A and 516B, respectively, and on outer portions of bottom surface 518. Oxide spacers 522A and 522B leave exposed a central portion of bottom surface 518.

Figure 5G:
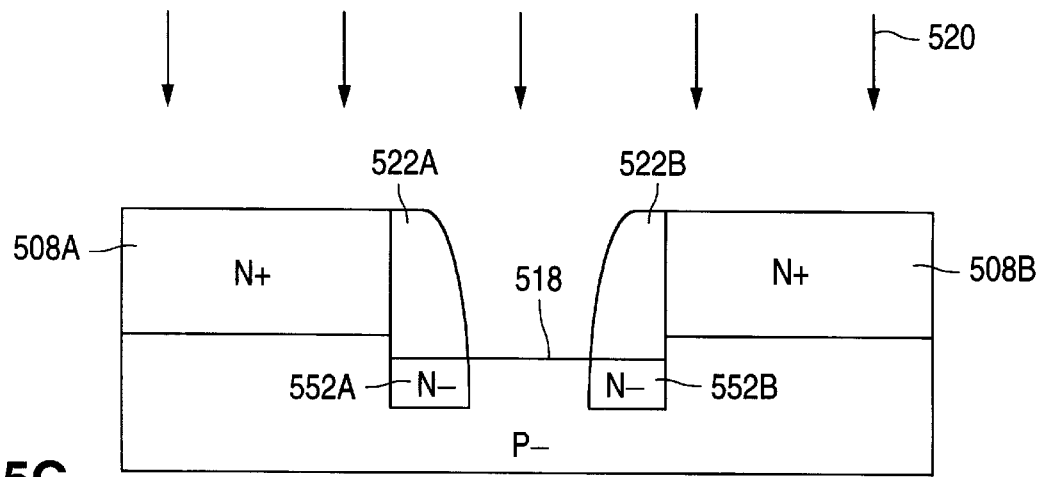

In FIG. 5G, a channel implant is provided by subjecting the structure to ion implantation of boron, as indicated by arrows 520. The channel implant differs from the channel implant in the first embodiment in several respects. First, the channel implant does not pass through all of bottom surface 518, instead, oxide spacers 522A and 522B provide an implant mask for the outer portions of bottom surface 518, and the channel implant passes through only the central portion of bottom surface 518. Second, the channel implant counterdopes doped layer 552 beneath the central portion of bottom surface 518, effectively splitting doped layer 552 into lightly doped source and drain regions 552A and 552B. Third, the boron dosage is about twice the boron dosage used in the first embodiment to assure adequate counterdoping of doped layer 552 beneath the central portion of bottom surface 518. Fourth, the boron is also implanted into heavily doped source and drain regions 508A and 508B, but lacks sufficient concentration to counterdope these regions.

Figure 5H:
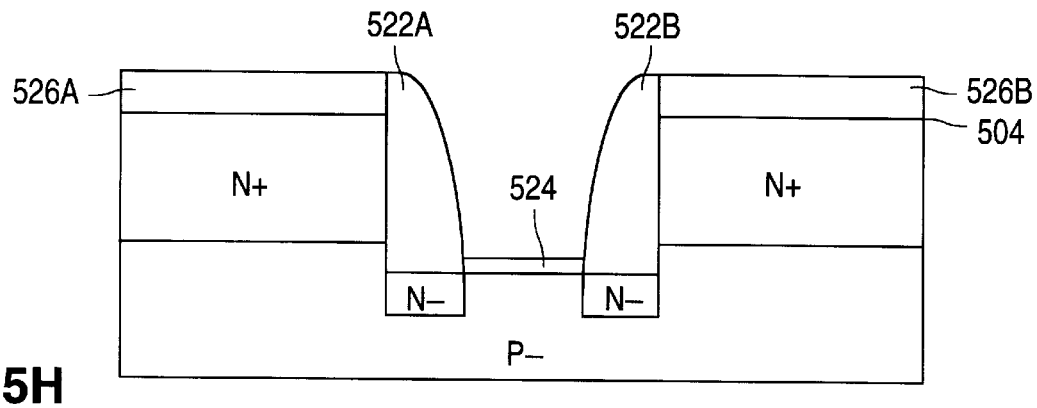

In FIG. 5H, gate oxide 524 is grown on the central portion of bottom surface 518, and oxide segments 526A and 526B are grown on top surface 504. The heights of oxide spacers 522A and 522B increase as well.

Figure 5I:
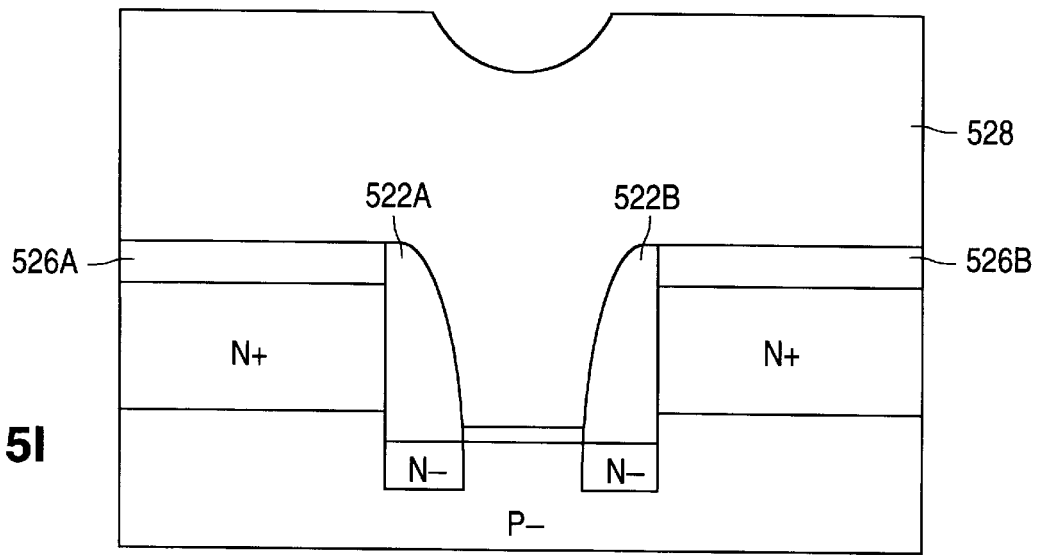

In FIG. 5I, a blanket layer of undoped polysilicon 528 is deposited over substrate 502. Polysilicon 528 contacts oxide spacers 522A and 522B, gate oxide 524 and oxide segments 526A and 526B and fills the remaining space in trench 514. Polysilicon 528 is then doped.

Figure 5J:
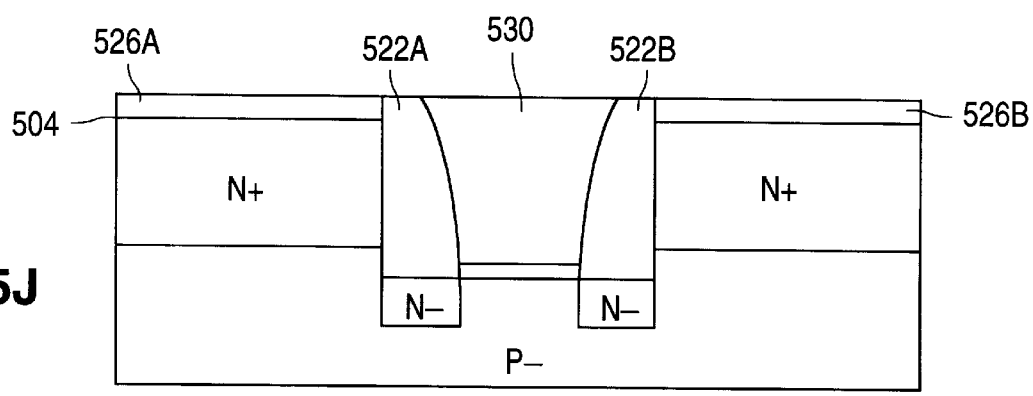

In FIG. 5J, the structure is planarized by applying chemical-mechanical polishing in the presence of an abrasive slurry that is highly selective of polysilicon with respect to silicon dioxide. The polishing grinds down regions of polysilicon 528, but is discontinued before reaching top surface 504. The remaining portion of polysilicon 528 forms polysilicon gate electrode 530, which is aligned with oxide spacers 522A and 522B and oxide segments 526A and 526B. Polysilicon gate electrode 530 is substantially aligned with top surface 504, and substantially all of polysilicon gate electrode 530 is within trench 514.

Figure 5K:
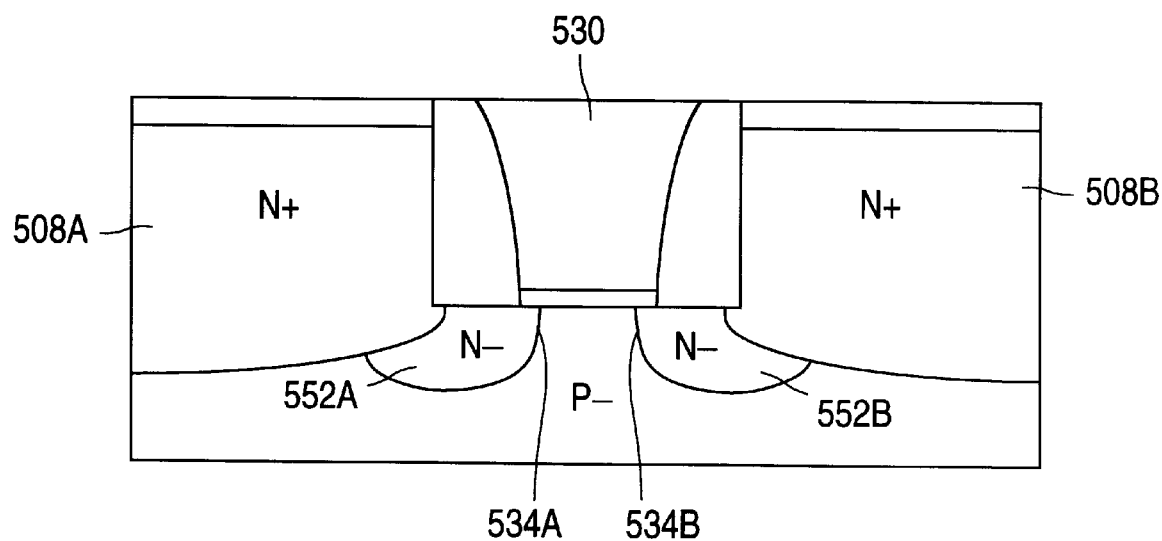

In FIG. 5K, a rapid thermal anneal on the order of 950 to 1050° C. for 10 to 30 seconds is applied to remove crystalline damage and to activate and drive-in the implanted dopants. Since heavily doped and lightly doped source and drain regions 508A, 508B, 552A and 552B are doped solely by arsenic, very little diffusion occurs. However, source regions 508A and 552A merge to form a source, and drain regions 508B and 552B merge to form a drain. Furthermore, lightly doped source and drain regions 552A and 552B form channel junctions 534A and 534B, respectively, that are substantially aligned with the bottom surface of polysilicon gate electrode 530.

Further processing steps in the fabrication of IGFETs typically include forming a thick oxide layer over the active regions, forming contact windows in the oxide layer above the source, drain and gate electrode, forming appropriate interconnect metallization in the contact windows, and then forming a passivation layer. In addition, either earlier or subsequent high-temperature process steps can be used to supplement or replace the drive-in step to provide the desired anneal, activation, and diffusion for the implanted dopants. These further processing steps are conventional and need not be repeated herein. Likewise the principal processing steps disclosed herein may be combined with other steps readily apparent to those skilled in the art.

At completion of the process, it is preferred that the channel length be precisely controlled. However, to the extent that the lateral locations of the channel junctions with the source and the drain are not (or can not be) precisely controlled, it is far preferable to have a slight overlap between the junctions and the gate electrode (where the gate electrode contacts the gate insulator) as opposed to a lateral displacement or gap. While a slight overlap leads to capacitive effects (known as "Miller capacitance") that tend to reduce switching speeds, a lateral displacement or gap may prevent formation of a conductive channel between the source and the drain during operation. Furthermore, decreasing the channel length increases the drive current. Therefore, the overlap between the gate electrode and the source and drain involves a tradeoff between switching speed and drive current.

The present invention includes numerous variations to the embodiments described above. For instance, various features of the above embodiments can be combined with others. An additional polish-stop layer can be formed on the top surface of the substrate before the etching the trench. Alternatively, if desired, the gate electrode material can be polished until it is aligned with the top surface of the substrate. The channel implant may not be essential and can provide enhancement-mode doping if desired. The source and drain can be spaced from the sidewalls, as long as they are adjacent to the bottom surface of the trench. Likewise, the insulative spacers need not necessarily extend to the top surface of the substrate, as long as the gate electrode remains electrically isolated from the substrate. The gate electrode can be patterned to extend beyond the trench length over the substrate. The gate electrode can be other conductors such as aluminum, titanium, tungsten, cobalt, and combinations thereof, although the material may be limited by the use of subsequent high-temperature steps. The gate insulator and insulative spacers can be various dielectrics including oxides, nitrides, and oxynitrides, formed in various manners that include deposition, tube growth and rapid thermal anneal growth. The insulative spacers can also be undoped polysilicon formed on the sidewall insulators and gate insulator. A polysilicon gate electrode can be deposited doped or undoped, and if deposited undoped can be doped either before or after it is polished. The N-type and P-type dopants can be reversed. Suitable P-type dopants include boron $B_{10}$, boron $B_{11}$, and $BF_x$ species such as $BF_2$.

Further details regarding trench transistors are disclosed in U.S. application Ser. No. 08/739,593 filed concurrently herewith, entitled "Trench Transistor With Metal Spacers" by Gardner et al.; U.S. application Ser. No. 08/739,592 filed concurrently herewith, entitled "Trench Transistor With Localized Source/Drain Regions Implanted Through Voids In Trench" by Gardner et al.; U.S. application Ser. No. 08/739,596 filed concurrently herewith, entitled "Trench Transistor With Localized Source/Drain Regions Implanted Through Selectively Grown Oxide Layer" by Gardner et al.; U.S. application Ser. No. 08/739,597 filed concurrently herewith, entitled "Trench Transistor In Combination With Trench Array" by Fulford, Jr. et al.; U.S. application Ser. No. 08/739,566 filed concurrently herewith, entitled "Trench Transistor And Isolation Trench" by Gardner et al.; and U.S. application Ser. No. 08/739,567 filed concurrently herewith, entitled "Trench Transistor With Source Contact In Trench" by Gardner et al.; the disclosures of which are incorporated herein by reference.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET with a gate electrode and insulative spacers in a trench, comprising the steps of:

forming a trench in a substrate;

forming insulative spacers in the trench;

forming a gate insulator on a bottom surface of the trench;

forming a gate electrode on the gate insulator such that the insulative spacers are between the gate electrode and opposing sidewalls of the trench and a majority of a thickness of the gate electrode is in the trench; and forming a source and a drain in the substrate and adjacent to the bottom surface, wherein forming the source and the drain includes implanting a first dopant into a top surface of the substrate to form a doped layer in the substrate before the trench is formed, and the first dopant has opposite conductivity type to the substrate.

2. The method of claim 1, wherein the gate insulator is formed before the insulative spacers are formed.

3. The method of claim 1, wherein the gate insulator is formed after the insulative spacers are formed.

4. The method of claim 1, wherein forming the source and the drain includes forming lightly doped source and drain regions adjacent to the bottom surface and heavily doped source and drain regions adjacent to a top surface of the substrate.

5. The method of claim 4, wherein the lightly doped source and drain regions and the heavily doped source and drain regions are adjacent to the sidewalls.

6. The method of claim 5, wherein the lightly doped source and drain regions are displaced from the top surface, and the heavily doped source and drain regions are displaced from the bottom surface.

7. The method of claim 5, wherein the lightly doped source and drain regions form channel junctions that are substantially aligned with a bottom surface of the gate electrode.

8. The method of claim 1, wherein forming the trench includes etching partially through the doped layer.

9. The method of claim 1, wherein forming the trench includes etching completely through the doped layer, thereby splitting the doped layer into source and drain regions that are spaced from the bottom surface.

10. The method of claim 9, further including diffusing the source and drain regions into the substrate after forming the trench, thereby forming the source and the drain.

11. The method of claim 1, wherein forming a channel includes forming the trench and then implanting a second dopant into the bottom surface, wherein the second dopant has a same conductivity type as the substrate.

12. The method of claim 11, wherein the second dopant is implanted before the insulative spacers are formed, before the gate insulator is formed, and before the gate electrode is formed.

13. The method of claim 11, wherein the second dopant is implanted after the insulative spacers are formed, and before the gate electrode is formed.

14. The method of claim 13, wherein forming the source and the drain includes implanting a first dopant into the bottom surface to form a lightly doped layer before the insulative spacers are formed, wherein the first dopant has opposite conductivity type to the substrate, and the second dopant counterdopes a region of the lightly doped layer between the insulative spacers.

15. The method of claim 1, wherein forming the trench includes patterning a photoresist layer over the substrate, and applying an anisotropic etch through an opening in the photoresist layer.

16. The method of claim 15, wherein a length between the sidewalls corresponds to a length of the opening, and a length of a channel between the source and the drain is less than half of the length between the sidewalls.

17. The method of claim 16, wherein the length of the opening represents a minimum resolution of a lithographic system used to define the opening.

18. The method of claim 1, wherein forming the insulative spacers includes depositing a blanket layer of insulative spacer material over the substrate and into the trench, and then applying an anisotropic etch.

19. The method of claim 18, wherein the insulative spacers are silicon dioxide.

20. The method of claim 1, wherein forming the gate electrode includes depositing a blanket layer of gate electrode material over the substrate and into the trench, and then polishing the gate electrode material until the gate electrode is substantially aligned with the top surface of the substrate.

21. The method of claim 1, wherein substantially all of the gate electrode is within the trench.

22. The method of claim 1, wherein the gate electrode is polysilicon, the gate insulator is silicon dioxide, and the insulative spacers are selected from the group consisting of silicon dioxide, silicon nitride and undoped polysilicon.

23. The method of claim 1, wherein the IGFET is an N-channel MOSFET.

24. The method of claim 1, wherein the IGFET is a P-channel MOSFET.

25. A method of forming an IGFET with a gate electrode and insulative spacers in a trench, comprising the steps of:

providing a semiconductor substrate;

providing a photoresist layer with an opening over the substrate;

applying a first anisotropic etch through the opening in the photoresist layer to form a trench partially through the substrate, wherein the trench extends to a top surface of the substrate and has opposing sidewalls and a bottom surface;

depositing a blanket layer of insulative spacer material over the substrate and then applying a second anisotropic etch to the blanket layer of insulative spacer material to form insulative spacers in the trench over outer portions of the bottom surface, wherein a central portion of the bottom surface between the insulative spacers is exposed;

forming a gate insulator on the central portion of the bottom surface;

depositing a blanket layer of gate electrode material over the substrate and then polishing the gate electrode material to form a gate electrode in the trench on the gate insulator and the insulative spacers, wherein the gate electrode is spaced from and electrically isolated from the substrate and a majority of a thickness of the gate electrode is in the trench; and forming a source and a drain in the substrate, wherein forming the source and the drain includes implanting a doped layer into the substrate before forming the trench, the source and the drain are adjacent to the top surface, the sidewalls, and the outer portions of the bottom surface, and the source and the drain provide channel junctions for a channel adjacent to the central portion of the bottom surface.

26. The method of claim 25, wherein forming the source and the drain includes:

forming the trench completely through the doped layer, thereby splitting the doped layer into source and drain regions that are adjacent to the sidewalls and spaced from the bottom surface; and applying a high-temperature anneal to activate the source and drain regions and diffuse the source and drain regions beneath the bottom surface to provide the channel junctions.

27. A method of forming an IGFET with a gate electrode and insulative spacers in a trench, comprising the steps of:

providing a semiconductor substrate;

providing a photoresist layer with an opening over the substrate;

applying a first anisotropic etch through the opening in the photoresist layer to form a trench partially through the substrate, wherein the trench extends to a top surface of the substrate and has opposing sidewalls and a bottom surface;

depositing a blanket layer of insulative spacer material over the substrate and then applying a second anisotropic etch to the blanket layer of insulative spacer material to form insulative spacers in the trench over outer portions of the bottom surface, wherein a central portion of the bottom surface between the insulative spacers is exposed;

forming a gate insulator on the central portion of the bottom surface;

depositing a blanket layer of gate electrode material over the substrate and then polishing the gate electrode material to form a gate electrode in the trench on the gate insulator and the insulative spacers, wherein the gate electrode is spaced from and electrically isolated from the substrate; and forming a source and a drain in the substrate, wherein the source and the drain are adjacent to the top surface, the sidewalls, and the outer portions of the bottom surface, and the source and the drain provide channel junctions for a channel adjacent to the central portion of the bottom surface;

wherein forming the source and the drain includes:

implanting source and drain regions into the substrate using the gate electrode and insulative spacers as an implant mask for the bottom surface; and applying a high-temperature anneal to activate the source and drain regions and diffuse the source and drain regions beneath the bottom surface to provide the channel junctions.

28. The method of claim 25, wherein forming the source and the drain includes:

forming the trench partially through the doped layer such that the doped layer is adjacent to the bottom surface;

counterdoping a region of the doped layer beneath the central portion of the bottom surface using the insulative spacers as an implant mask, thereby splitting the doped layer into source and drain regions; and applying a high-temperature anneal to activate the source and drain regions.

29. The method of claim 28, wherein:

the doped layer includes a doped upper layer adjacent to the top surface and spaced from the bottom surface, and includes a doped lower layer adjacent to the bottom surface and spaced from the top surface;

the trench is formed completely through the doped upper layer and partially through the doped lower layer; and the doped lower layer provides the channel junctions.

30. The method of claim 25, wherein forming the source and the drain includes:

forming the trench completely through the doped layer, thereby splitting the doped layer into first source and drain regions that are adjacent to the sidewalls and spaced from the bottom surface;

implanting a second doped layer through the bottom surface;

counterdoping a region of the second doped layer beneath the central portion of the bottom surface using the insulative spacers as an implant mask, thereby splitting the second doped layer into second source and drain regions; and applying a high-temperature anneal to activate the first and second source and drain regions, to merge the first and second source regions, and to merge to first and second drain regions, wherein the first source and drain regions are adjacent to the top surface and the second source and drain regions provide the channel junctions.

31. A method of forming an IGFET with a gate electrode and insulative spacers in a trench, comprising the step of:

forming a trench in a substrate;

forming insulative spacers in the trench;

forming a gate insulator on a bottom surface of the trench after forming the insulative spacers;

forming a gate electrode on the gate insulator such that the insulative spacers are between the gate electrode and opposing sidewalls of the trench and a majority of a thickness of the gate electrode is in the trench; and forming a source and a drain in the substrate and adjacent to the bottom surface.

32. A method of forming an IGFET with a gate electrode and insulative spacers in a trench, comprising the step of:

forming a trench in a substrate;

forming insulative spacers in the trench;

forming a gate insulator on a bottom surface of the trench;

forming a gate electrode on the gate insulator such that the insulative spacers are between the gate electrode and opposing sidewalls of the trench and a majority of a thickness of the gate electrode is in the trench; and forming a source and a drain in the substrate and adjacent to the bottom surface, wherein a length of a channel between the source and the drain is less than half of a length between the sidewalls.

33. A method of forming an IGFET with a gate electrode and insulative spacers in a trench, comprising the steps of:

forming a trench in a substrate;

depositing a blanket layer of insulative spacer material over the substrate and into the trench;

applying an anisotropic etch to the insulative spacer material to form insulative spacers in the trench;

forming a gate insulator on a bottom surface of the trench;

forming a gate electrode on the gate insulator such that the insulative spacers are between the gate electrode and opposing sidewalls of the trench and a majority of a thickness of the gate electrode is in the trench; and forming a source and a drain in the substrate and adjacent to the bottom surface.

34. A method of forming an IGFET with a gate electrode and insulative spacers in a trench, comprising the steps of:

forming a trench in a substrate;

forming insulative spacers in the trench;

implanting a channel dopant with a same conductivity type as the substrate into the bottom surface after the insulative spacers are formed;

forming a gate insulator on a bottom surface of the trench after implanting the channel dopant;

forming a gate electrode on the gate insulator such that the insulative spacers are between the gate electrode and opposing sidewalls of the trench and a majority of a thickness of the gate electrode is in the trench, wherein all of the gate electrode is formed after implanting the channel dopant; and forming a source and a drain in the substrate and adjacent to the bottom surface.

35. A method of forming an IGFET with a gate electrode and insulative spacers in a trench, comprising the steps of:

forming a trench in a substrate;

forming insulative spacers in the trench;

forming a gate insulator on a bottom surface of the trench;

forming a gate electrode on the gate insulator such that the insulative spacers are between the gate electrode and opposing sidewalls of the trench and a majority of a thickness of the gate electrode is in the trench;

forming a source and a drain in the substrate and adjacent to the bottom surface, wherein forming the source and the drain includes implanting a first dopant into the bottom surface to form a lightly doped layer before the insulative spacers are formed, the first dopant has opposite conductivity type to the substrate; and forming a channel between the source and the drain, wherein forming the channel includes implanting a second dopant into the bottom surface after the insulative spacers are formed and before the gate electrode is formed, the second dopant has a same conductivity type as the substrate, and the second dopant counter-dopes a region of the lightly doped layer between the insulative spacers.

36. A method of forming an IGFET with a gate electrode and insulative spacers in a trench, comprising the steps of:

forming a trench in a substrate;

forming a continuous insulative layer on a bottom surface and opposing sidewalls of the trench;

forming insulative spacers in the trench and on the continuous insulative layer without contacting the Substrate, wherein a central portion of the insulative layer on the bottom surface and between the spacers forms a gate insulator;

forming a gate electrode on the gate insulator such that the insulative spacers are between the gate electrode and the sidewalls and a majority of a thickness of the gate electrode is in the trench; and forming a source and a drain in the substrate and adjacent to the bottom surface.

37. A method of forming an IGFET with a gate electrode and insulative spacers in a trench, comprising the steps of:

forming a trench in a substrate that extends beneath a top surface of the substrate;

forming insulative spacers in the trench;

forming a gate insulator on a bottom surface of the trench;

forming a gate electrode on the gate insulator such that the insulative spacers are between the gate electrode and opposing sidewalls of the trench and a majority of a thickness of the gate electrode is in the trench; and forming a source and a drain in the substrate, wherein the source and drain include lightly doped source and drain regions adjacent to the bottom surface and displaced from the top surface, and the source and drain include heavily doped source and drain regions adjacent to the top surface and displaced from the bottom surface.

38. A method of forming an IGFET with a gate electrode and insulative spacers in a trench, comprising the steps of:

patterning a photoresist layer over a substrate;

applying an anisotropic etch through an opening in the photoresist layer to form a trench in a substrate using the photoresist layer as an etch mask;

implanting a channel dopant with a same conductivity type as the substrate through the opening in the photoresist layer into the bottom surface using the photoresist layer as an implant mask;

forming insulative spacers in the trench;

forming a gate insulator on a bottom surface of the trench;

forming a gate electrode on the gate insulator such that the insulative spacers are between the gate electrode and opposing sidewalls of the trench and a majority of a thickness of the gate electrode is in the trench; and forming a source and a drain in the substrate and adjacent to the bottom surface.

39. A method of forming an IGFET with a gate electrode and insulative spacers in a trench, comprising the steps of:

forming a trench in a substrate;

forming insulative spacers in the trench;

forming a gate insulator on a bottom surface of the trench after forming the insulative spacers;

depositing a blanket layer of gate electrode material over the substrate and into the trench, thereby filling any remaining space in the trench;

polishing the gate electrode material to form a gate electrode with a planar top surface, wherein the gate electrode is on the gate insulator and the insulative spacers are between the gate electrode and opposing sidewalls of the trench and a majority of a thickness of the gate electrode is in the trench; and forming a source and a drain in the substrate and adjacent to the bottom surface.

40. A method of forming an IGFET with a gate electrode and insulative spacers in a trench, comprising the steps of:

forming a trench in a substrate;

forming insulative spacers in the trench;

forming a gate insulator on a bottom surface of the trench;

forming a gate electrode on the gate insulator such that the insulative spacers are between the gate electrode and opposing sidewalls of the trench and a majority of a thickness of the gate electrode is in the trench; and forming a source and a drain in the substrate and adjacent to the bottom surface, wherein at least some doping for the source and drain is provided before forming the trench.

* * * * *